(12) United States Patent
Satou et al.

(10) Patent No.: US 12,095,224 B2
(45) Date of Patent: Sep. 17, 2024

(54) LIGHT EMITTING ELEMENT ASSEMBLY, MULTI-BEAM LASER CHIP ASSEMBLY AND STEREOLITHOGRAPHIC APPARATUS, AND MEMBER ASSEMBLY AND METHOD FOR MANUFACTURING THE SAME

(71) Applicant: Sony Group Corporation, Tokyo (JP)

(72) Inventors: Kei Satou, Tokyo (JP); Jugo Mitomo, Tokyo (JP)

(73) Assignee: Sony Group Corporation, Tokyo (JP)

( * ) Notice: Subject to any disclaimer, the term of this patent is extended or adjusted under 35 U.S.C. 154(b) by 640 days.

(21) Appl. No.: 17/427,955

(22) PCT Filed: Jan. 17, 2020

(86) PCT No.: PCT/JP2020/001493
§ 371 (c)(1),
(2) Date: Aug. 3, 2021

(87) PCT Pub. No.: WO2020/162142
PCT Pub. Date: Aug. 13, 2020

(65) Prior Publication Data
US 2022/0131338 A1 Apr. 28, 2022

(30) Foreign Application Priority Data
Feb. 5, 2019 (JP) .................. 2019-018808

(51) Int. Cl.
*H01S 5/0237* (2021.01)
*H01L 33/48* (2010.01)
(Continued)

(52) U.S. Cl.
CPC .......... *H01S 5/0237* (2021.01); *H01L 33/486* (2013.01); *H01S 5/02253* (2021.01); *H01S 5/423* (2013.01)

(58) Field of Classification Search
CPC ...... H01S 5/0237; H01S 5/02253; H01S 5/42; H01S 5/423; H01L 33/486
(Continued)

(56) References Cited

U.S. PATENT DOCUMENTS 5,729,561 A * 3/1998 Hironaka ................ H01L 24/32
372/36
7,606,275 B2 * 10/2009 Kunimasa ............... H01L 24/32
372/36
(Continued)

FOREIGN PATENT DOCUMENTS

JP   H09-064479 A   3/1997
JP   2003-158332 A   5/2003
(Continued)

OTHER PUBLICATIONS

International Search Report issued in International Patent Application No. PCT/JP2020/001493 on Mar. 24, 2020 and English translation of same. 5 pages.
Written Opinion issued in International Patent Application No. PCT/JP2020/001493 on Mar. 24, 2020. 4 pages.

*Primary Examiner* — Matthew E. Gordon
(74) *Attorney, Agent, or Firm* — K&L Gates LLP

(57) ABSTRACT

A light emitting element assembly includes: a light emitting element (21); a light emitting element drive unit (30); a first joining member (41) connected to an electrode provided in the light emitting element (21); and a second joining member (42) provided on the light emitting element drive unit (30). In the light emitting element assembly, one of the first joining member (41) and the second joining member (42) includes an alloy material, the other one of the first joining member (41) and the second joining member (42) includes a metallic material, the joining member (the second joining member (42)) including the alloy material includes a first portion (43) and a second portion (44), the joining member (the first joining member (41)) including the metallic mate-
(Continued)

rial and the first portion (43) are joined to each other, and the second portion (44) is provided on the light emitting element drive unit (30) between the light emitting element (21) and the light emitting element drive unit (30), and is in contact with the light emitting element (21).

17 Claims, 18 Drawing Sheets

(51) Int. Cl.
*H01S 5/02253* (2021.01)
*H01S 5/42* (2006.01)

(58) Field of Classification Search
USPC .......................................................... 257/81
See application file for complete search history.

(56) References Cited

U.S. PATENT DOCUMENTS

| | | | | |
|---|---|---|---|---|
| 2004/0092055 | A1* | 5/2004 | Liu | H01L 33/486 |
| | | | | 257/E31.117 |
| 2008/0279246 | A1* | 11/2008 | Nakatsuka | H01S 5/0235 |
| | | | | 372/50.12 |
| 2020/0006271 | A1* | 1/2020 | Chen | H01L 24/11 |
| 2020/0014169 | A1* | 1/2020 | Yu | H01L 24/73 |
| 2020/0105961 | A1* | 4/2020 | Boone | H01S 5/0201 |

FOREIGN PATENT DOCUMENTS

| | | |
|---|---|---|
| JP | 2006-351589 A | 12/2006 |
| JP | 2008-277471 A | 11/2008 |
| JP | 2014-22481 A | 2/2014 |

\* cited by examiner

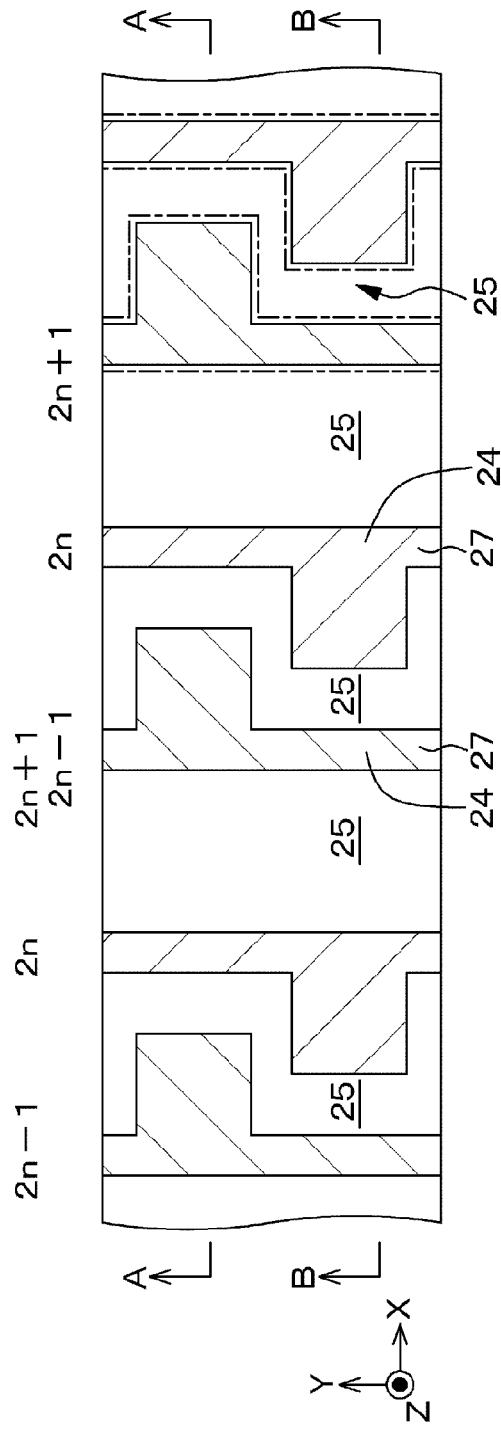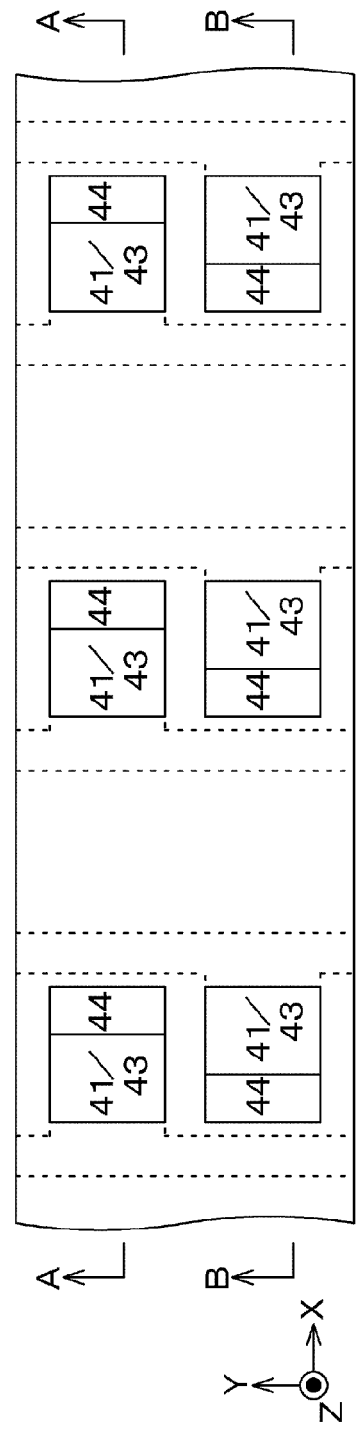
FIG. 2A
FIG. 2B

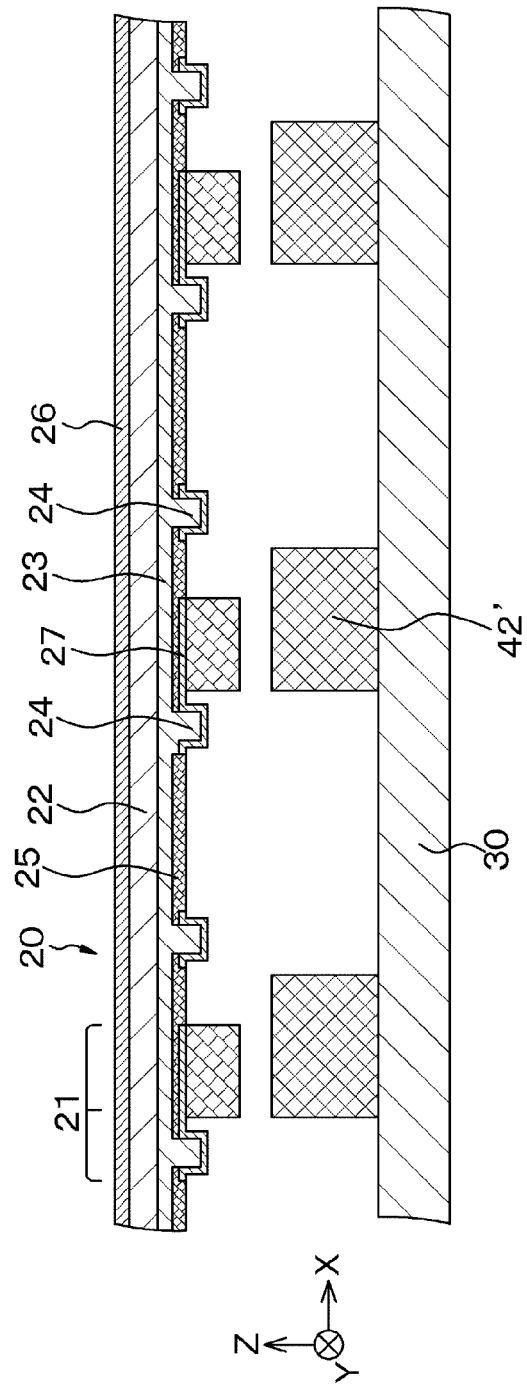

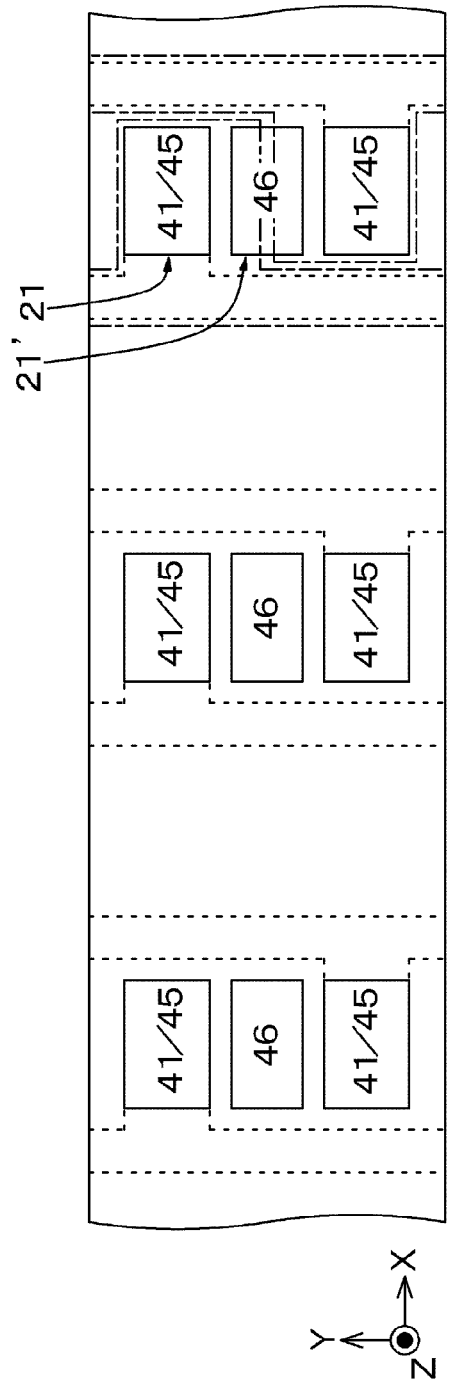

LIGHT EMITTING ELEMENT ASSEMBLY, MULTI-BEAM LASER CHIP ASSEMBLY AND STEREOLITHOGRAPHIC APPARATUS, AND MEMBER ASSEMBLY AND METHOD FOR MANUFACTURING THE SAME

TECHNICAL FIELD

The present disclosure relates to a light emitting element assembly, a multi-beam laser chip assembly and a stereolithographic apparatus, and a member assembly and a method for manufacturing the member assembly.

BACKGROUND ART

In various kinds of apparatuses, such as a stereolithographic apparatus, a laser printer, a laser display apparatus, and a measuring apparatus, for example, a multi-beam laser chip in which a plurality of laser elements is arranged adjacent to one another is widely used these days (see Japanese Patent Application Laid-Open No. 2003-158332, for example). Further, a plurality of laser elements is often joined to a submount (see Japanese Patent Application Laid-Open No. 2008-277471, for example).

CITATION LIST

Patent Documents

Patent Document 1: Japanese Patent Application Laid-Open No. 2003-158332
Patent Document 2: Japanese Patent Application Laid-Open No. 2008-277471

SUMMARY OF THE INVENTION

Problems to be Solved by the Invention

Meanwhile, at the time of manufacturing or assembling, warpage often occurs in a multi-beam laser chip. Therefore, in the technology disclosed in Japanese Patent Application Laid-Open No. 2008-277471, stress absorbing portions that contain air gaps and a soft material are provided under electrodes provided in the laser elements serving as the joint portions for the submount. Thus, the stress generated by the difference in thermal expansion between the laser elements and the submount is alleviated. However, the formation of the stress absorbing portions involves a large number of steps, and the formation process is complicated. Further, it is difficult to form a metallic film on indium or a photoresist due to a problem related to the melting point.

Therefore, the present disclosure aims to provide a light emitting element assembly that can prevent warpage despite its simple configuration and structure, a multi-beam laser chip assembly and a stereolithographic apparatus, and a member assembly and a method for manufacturing the member assembly.

Solutions to Problems

A light emitting element assembly of the present disclosure for achieving the above objective includes:
a light emitting element;
a light emitting element drive unit;
a first joining member connected to an electrode provided in the light emitting element; and
a second joining member provided on the light emitting element drive unit,
in which
one of the first joining member and the second joining member includes an alloy material,
the other one of the first joining member and the second joining member includes a metallic material,
the joining member including the alloy material includes a first portion and a second portion,
the joining member including the metallic material and the first portion are joined to each other, and,
between the light emitting element and the light emitting element drive unit, the second portion is provided on one of the light emitting element and the light emitting element drive unit, and is in contact with the other one of the light emitting element and the light emitting element drive unit.

A multi-beam laser chip assembly of the present disclosure for achieving the above objective includes a plurality of light emitting element assemblies that are arranged adjacent to one another,
in which
each light emitting element assembly includes:
a light emitting element including a laser element;
a light emitting element drive unit;
a first joining member connected to an electrode provided in the light emitting element; and
a second joining member provided on the light emitting element drive unit,
one of the first joining member and the second joining member includes an alloy material,
the other one of the first joining member and the second joining member includes a metallic material,
the joining member including the alloy material includes a first portion and a second portion,
the joining member including the metallic material and the first portion are joined to each other, and,
between the light emitting element and the light emitting element drive unit, the second portion is provided on one of the light emitting element and the light emitting element drive unit, and is in contact with the other one of the light emitting element and the light emitting element drive unit.

A stereolithographic apparatus of the present disclosure for achieving the above objective includes:
a multi-beam laser chip assembly; and
a condensing member that condenses light emitted from the multi-beam laser chip assembly,
in which
the multi-beam laser chip assembly includes a plurality of light emitting element assemblies that are arranged adjacent to one another,
each light emitting element assembly includes:
a light emitting element including a laser element;
a light emitting element drive unit;
a first joining member connected to an electrode provided in the light emitting element; and
a second joining member provided on the light emitting element drive unit,
one of the first joining member and the second joining member includes an alloy material,
the other one of the first joining member and the second joining member includes a metallic material,
the joining member including the alloy material includes a first portion and a second portion,
the joining member including the metallic material and the first portion are joined to each other, and, between the light emitting element and the light emitting element drive unit, the second portion is provided on one of the light emitting element and the light emitting element drive unit, and is in contact with the other one of the light emitting element and the light emitting element drive unit.

A member assembly of the present disclosure for achieving the above objective includes:
a first member;
a second member;
a first joining member provided on the first member; and
a second joining member provided on the second member, in which
the first joining member includes a metallic material,
the second joining member includes an alloy material,
the second joining member includes a first portion and a second portion,
the first joining member and the first portion are joined to each other, and
the second portion is disposed between the first member and the second member, and is in contact with the first member.

A member assembly manufacturing method of the present disclosure for achieving the above objective includes:
preparing a first member on which a first joining member including a metallic material is provided, and a second member that includes a first portion and a second portion, a second joining member including an alloy material being provided on the second member; and,
with the first portion of the second joining member being in contact with the first joining member, melting and joining the first portion to the first joining member, and bringing the second portion into contact with the first member, by heating the first joining member and the second joining member while applying pressure between the first member and the second member.

BRIEF DESCRIPTION OF DRAWINGS

FIG. 1A and FIG. 1B are schematic partial cross-sectional views taken along arrows A-A and arrows B-B defined in FIG. 2A and FIG. 2B.

FIG. 2A and FIG. 2B are partial layout diagrams schematically showing the layout of the components of the light emitting element assembly, the multi-beam laser chip assembly, and the member assembly of the first embodiment.

FIG. 3 is a schematic partial cross-sectional view of a light emitting element assembly and the like for explaining a method for manufacturing the light emitting element assembly, the multi-beam laser chip assembly, and the member assembly of the first embodiment.

FIG. 9 is a partial layout diagram schematically showing the layout of the components of a light emitting element assembly, a multi-beam laser chip assembly, and a member assembly of a second embodiment.

FIG. 10A is a schematic partial cross-sectional view taken along arrows A-A defined in FIG. 10B.

MODES FOR CARRYING OUT THE INVENTION

Figure 1A:
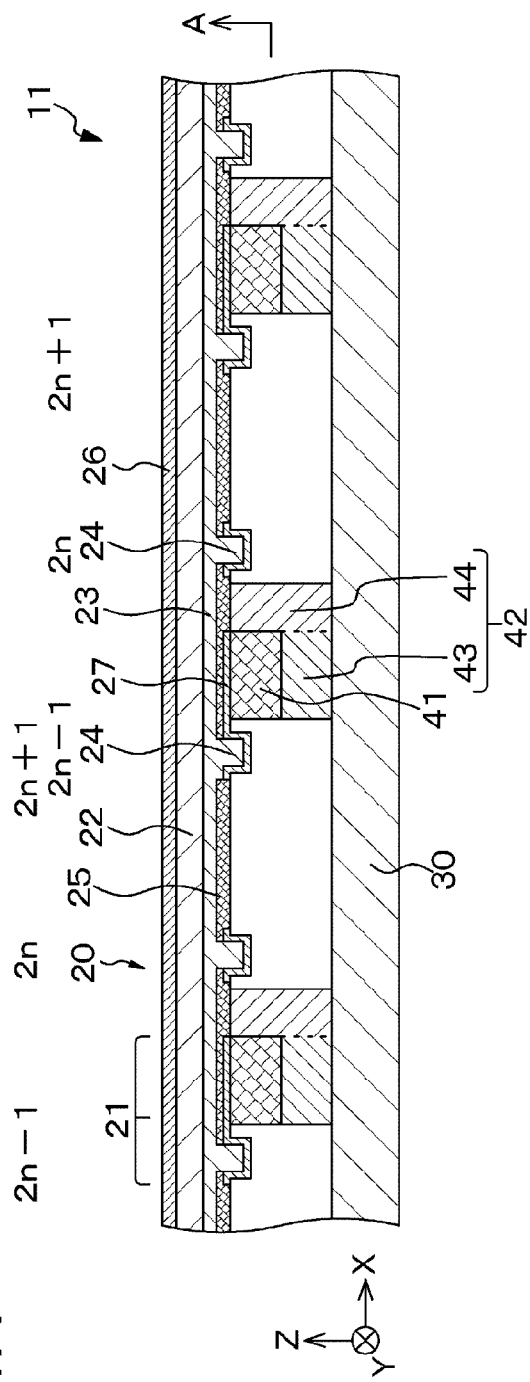
FIG. 1A and FIG. 1B are schematic partial cross-sectional views of a light emitting element assembly, a multi-beam laser chip assembly, and a member assembly of a first embodiment.

The following is a description of the present disclosure based on embodiments, with reference to the drawings. However, the present disclosure is not limited to the embodiments, and the various numerical values and materials mentioned in the embodiments are merely examples. Note that explanation will be made in the following order.
1. General description of a light emitting element assembly, a multi-beam laser chip assembly and a stereolithographic apparatus, a member assembly and a method for manufacturing the member assembly according to the present disclosure 2. First embodiment (a light emitting element assembly and a multi-beam laser chip assembly, and a member assembly and a method for manufacturing the member assembly according to the present disclosure).
3. Second embodiment (a modification of the first embodiment)
4. Third embodiment (a stereolithographic apparatus)
5. Other aspects <General Description of a Light Emitting Element Assembly, a Multi-Beam Laser Chip Assembly and a Stereolithographic Apparatus, a Member Assembly and a Method for Manufacturing the Member Assembly According to the Present Disclosure>

In a mode of a stereolithographic apparatus of the present disclosure, a condensing member can be formed with a convergent rod lens. Further, in the stereolithographic apparatus of the present disclosure including such a preferred mode, light collected by the condensing member can be formed into an image on a photocurable resin, and the photocurable resin can be cured. Note that the respective lens portions constituting the convergent rod lens are disposed so as to face the light emitting portions of light emitting elements.

In a multi-beam laser chip assembly of the present disclosure, or in a stereolithographic apparatus of the present disclosure (hereinafter, these may be collectively referred to as a "multi-beam laser chip assembly and the like of the present disclosure" in some cases),
the number of the light emitting element assemblies constituting the multi-beam laser chip assembly is 2N (N is an integer of 2 or greater), and,
where n is an integer that is not smaller than 1 and not greater than N, a first joining member and a second joining member are disposed between the light emitting portion of the (2n−1)th light emitting element and the light emitting portion of the 2nth light emitting element, but are not disposed between the light emitting portion of the 2nth light emitting element and the light emitting portion of the (2n+1)th light emitting element, so that the pitch of the layout of the light emitting elements can be narrowed. However, embodiments are not limited to such a mode, and a first joining member and a second joining member may be disposed between the light emitting portion of the mth light emitting element and the light emitting portion of the (m+1)th light emitting element [here, m=1, 2, 3, . . . , (2N−1)] in some mode. Alternatively, a first joining member and a second joining member may be disposed between the light emitting portion of the mth light emitting element and the light emitting portion of the (m+1)th light emitting element [here, m=1, 2, 3, . . . , (2N−1)], while a first joining member and a second joining member are not disposed between the light emitting portion of a desired m'th light emitting element and the light emitting portion of the (m'+1) the light emitting element [here, m' is an integer of 2 to (2N−1)]. Alternatively, a first joining member and the second joining member may not be disposed in the region on the outer side of the light emitting portion of the first light emitting element and in the region on the outer side of the 2Nth light emitting element, a first joining member and a second joining member may be disposed between the light emitting portion of the first light emitting element and the light emitting portion of the second light emitting element, and a first joining member and a second joining member may be disposed between the light emitting portion of the (2N−1)th light emitting element and the light emitting portion of the 2Nth light emitting element. Further, in these modes, the distances between the light emitting elements can be easily made shorter, while the distances between the light emitting elements in the entire multi-beam laser chip assembly are made equal. In some cases, an aggregate of the 2N light emitting elements is referred to as a "multi-beam laser chip", for convenience sake.

Further, in a multi-beam laser chip assembly and the like of the present disclosure including the preferred modes described above, the distance between the light emitting portions of light emitting elements is preferably 10 µm or longer and 100 µm or shorter, or preferably 50 µm or shorter in some mode, to achieve reliable junctions based on eutectic crystal and in view of resolution, as will be described later. The distances between the light emitting portions of the respective light emitting elements are preferably equal. Further, in a multi-beam laser chip assembly of the present disclosure including the various preferred modes described above, N≥25 can be satisfied. That is, a multi-beam laser chip may include 50 or more light emitting elements in some mode.

Further, in a multi-beam laser chip assembly and the like of the present disclosure including the various preferred modes described above, a light emitting element drive unit can be formed with a submount. In this case, the submounts can be arranged in the longitudinal direction of the multi-beam laser chip. Further, external input electrode pads may be provided on the submounts, and the external input electrode pads can be disposed on the opposite side from the light emitting portions of the multi-beam laser chip, and in a region within the length of the multi-beam laser chip in the longitudinal direction. Alternatively, in a multi-beam laser chip assembly of the present disclosure including the various preferred modes described above, a light emitting element drive unit can be formed with a semiconductor substrate in which a light emitting element drive circuit is provided.

Alternatively, in a multi-beam laser chip assembly and the like of the present disclosure including the various preferred modes and configurations described above, the distances between the light emitting portions of the light emitting elements may be set so that the light density $P_A$ at an imaging center A and the light density $P_C$ at a position C satisfies the relationship $P_C \geq 0.5 P_A$, where A represents the imaging center of light emitted from one light emitting element, B represents the imaging center of light emitted from a light emitting element adjacent to the one light emitting element, and C represents the position at the dichotomy point between the imaging center A and the imaging center B.

The light emitting element drive units may be mounted on a heat transfer plate, or may be mounted on a cooling member. A plurality of light emitting element assemblies is accommodated in a housing, and a cooling mechanism that cools the heat generated by the plurality of light emitting element assemblies may be provided in the housing.

In a light emitting element assembly of the present disclosure, or in a light emitting element assembly forming a multi-beam laser chip assembly of the present disclosure including the various preferred modes and configurations described above, or in a light emitting element assembly in a multi-beam laser chip assembly forming a stereolithographic apparatus of the present disclosure including the various preferred modes and configurations described above, or in a member assembly of the present disclosure, or in a member assembly obtained by a member assembly manufacturing method of the present disclosure (hereinafter, these may be collectively referred to as a "light emitting element assembly and the like of the present disclosure), a second portion and a first portion can be disposed adjacent to each other. That is, part of a side surface of the second portion can be in contact with part of a side surface of the first portion.

Alternatively, in a light emitting element assembly and the like of the present disclosure, the second portion may be disposed at a distance from the first portion. That is, any side surface of the second portion may not be in contact with any side surface of the first portion. In this case, between the light emitting element (or a light emitting element extension portion) and the light emitting element drive unit, the second portion is disposed on one of the light emitting element (or the light emitting element extension portion) and the light emitting element drive unit, and is in contact with the other one of the light emitting element (or the light emitting element extension portion) and the light emitting element drive unit.

In a light emitting element assembly and the like of the present disclosure including the preferred modes described above, $H_1<H_2$ can be satisfied, where $H_1$ represents the height of the first portion, and $H_2$ represents the height of the second portion.

In a light emitting element assembly and the like of the present disclosure including the preferred modes described above, the alloy material may contain atoms forming the metallic material. Further, in this case, the first portion and the joining member including the metallic material are preferably joined to each other on the basis of eutectic crystal accompanied by diffusion of the atoms forming the metallic material. Further, in these cases, the alloy material can be formed with a gold-tin (Au—Sn) solder material, and the metallic material can be formed with gold (Au). In some cases, part of the first joining member including the surface (the opposing surface) of the first joining member facing the second joining member may be formed with gold (Au). Further, in these cases, the melting point of the alloy material forming the region of the first portion adjacent to the joining member including the metallic material may be lower than the melting point of the alloy material forming the second portion. In this case, the composition of the alloy material forming the region of the first portion adjacent to the joining member including the metallic material can be different from the composition of the alloy material forming the second portion. Furthermore, in these cases, the tin content of the alloy material that is formed with a gold-tin (Au—Sn) solder material and forms the region of the first portion adjacent to the joining member including the metallic material is 18% by mass to 29 by mass %, and the tin content of the alloy material that is formed with a gold-tin (Au—Sn) solder material and forms the second portion is smaller than 18% by mass or greater than 29% by mass. That is, before the joining member including the metallic material and the first portion are joined to each other, the second portion and the first portion have the same composition. After the joining member including the metallic material and the first portion are jointed to each other, the region of the first portion adjacent to the joining member including the metallic material may have a different composition from that of the second portion. In a case where the second portion is disposed at a distance from the first portion, the second portion and the first portion may be formed with different materials or different compositions.

Further, in a light emitting element assembly of the present disclosure including the preferred modes and configurations described above, a light emitting element may be formed with a laser element (an end-emitting semiconductor laser element) that emits light from an end face. However, light emitting elements are not limited to such a mode, and may be formed with end-emitting super luminescent diodes (SLDs), surface-emitting laser elements (also called vertical resonator lasers, or VCSELs), or light emitting diodes (LEDs).

Further, in a light emitting element assembly of the present disclosure including the preferred modes and configurations described above, a light emitting element drive unit may be formed with a submount, or may be formed with a semiconductor substrate in which a light emitting element drive circuit is provided.

Further, in a light emitting element assembly and the like of the present disclosure including the preferred modes and configurations described above, it is preferable to satisfy $S_1/(S_1+S_2)<1$, and it is more preferable to satisfy $0.5 \leq S_1/(S_1+S_2) \leq 0.9$, where $S_1$ represents the cross-sectional area of a first portion, and $S_2$ represents the cross-sectional area of a second portion, cut in a virtual plane orthogonal to the thickness direction. Where $S_3$ represents the cross-sectional area of a joining member including the metallic material when cut in a virtual plane orthogonal to the thickness direction, $S_1>S_3$ is satisfied in some cases, and $S_1=S_3$ or $S_1<S_3$ is satisfied in other cases. Also, in the light emitting element assembly of the present disclosure including the preferred modes and configurations described above, in a case where a light emitting element is formed with an end-emitting semiconductor laser element, the light reflectance of the light emitting portion (the front end face) is preferably not lower than 5% and not higher than 90%, and the light reflectance of the surface (the back end face) facing the light emitting portion is preferably not lower than 60% but is lower than 100%.

In a light emitting element assembly and the like of the present disclosure including the preferable modes and configurations described above, a first joining member and a second joining member can be formed on the basis of a combination of a patterning technique and a film forming method formed with a chemical vapor deposition method (CVD method) or a physical vapor deposition method (PVD method) such as a vacuum vapor deposition method or a sputtering method, for example, a plating technique, a printing technique, or the like.

A light emitting element has a stack structure in which a first compound semiconductor layer having a first conductivity type (n type, for example), a light emitting layer (an active layer), and a second compound semiconductor layer having a second conductivity type (p type, for example) different from the first conductivity type are stacked. A first electrode can be electrically connected to the first compound semiconductor layer, and a second electrode can be electrically connected to the second compound semiconductor layer in this structure. The light emitting layer (active layer) may be formed with a single compound semiconductor layer as an active layer, but preferably has a quantum well structure. Specifically, the light emitting layer (active layer) may have a single quantum well structure (SQW structure), or may have a multiple quantum well structure (MQW structure). The first compound semiconductor layer and the second compound semiconductor layer are also called a first cladding layer and a second cladding layer. Each of the first compound semiconductor layer and the second compound semiconductor layer may be a layer having a single-layer structure, a layer having a multilayer structure, or a layer having a superlattice structure, or may even be a layer including a composition gradient layer and a concentration gradient layer.

Examples of colors of light to be emitted by a light emitting element include any color such as red, green, blue, and purple. Examples of the material forming the light emitting layers of a red light emitting element that emits red light, a green light emitting element that emits green light, and a blue light emitting element that emits blue light include those using a group III-V compound semiconductor, and further, examples of the material forming the light emitting layer of a red light emitting element include those using an AlGaInP-based compound semiconductor.

Examples of the group III-V compound semiconductor include GaN-based compound semiconductors (including AlGaN mixed crystal or AlInGaN mixed crystal, and InGaN mixed crystal), and further, these compound semiconductors may contain boron (B) atoms, thallium (Tl) atoms, arsenic (As) atoms, phosphorus (P) atoms, or antimony (Sb) atoms, as desired. Examples of combinations of (the compound semiconductor forming the well layer and the compound semiconductor forming the barrier layer) in a light emitting layer having a quantum well structure may include ($In_y Ga_{(1-y)}N$, GaN), ($In_y Ga_{(1-y)}N$, $In_z Ga_{(1-y)}N$) [where y>z], and ($In_y Ga_{(1-y)}N$, AlGaN).

Alternatively, the group III-V compound semiconductor may be a GaInNAs-based compound semiconductor (including GaInAs mixed crystal or GaNAs mixed crystal), an AlGaInP-based compound semiconductor, an AlAs-based compound semiconductor, an AlGaInAs-based compound semiconductor, an AlGaAs-based compound semiconductor, a GaInAs-based compound semiconductor, a GaInAsP-based compound semiconductor, a GaInP-based compound semiconductor, a GaP-based compound semiconductor, an InP-based compound semiconductor, an InN-based compound semiconductor, or an AlN-based compound semiconductor, for example.

In a case where the first conductivity type is the n type, the second conductivity type is the p type. In a case where the first conductivity type is the p type, the second conductivity type is the n type. Examples of n-type impurities added to the compound semiconductor layers include silicon (Si), selenium (Se), germanium (Ge), tin (Sn), carbon (C), and titanium (Ti). Examples of p-type impurities include zinc (Zn), magnesium (Mg), beryllium (Be), cadmium (Cd), calcium (Ca), barium (Ba), and oxygen (O).

Examples of methods (film forming methods) for forming the various compound semiconductor layers including the active layer include a metalorganic chemical vapor deposition method (MOCVD method), a metalorganic vapor phase epitaxy method (MOVPE method), a molecular beam epitaxy method (MBE method), a metalorganic molecular beam epitaxy method (MOMBE method), a hydride vapor phase epitaxy method (HVPE method) in which halogen contributes to transport or reaction, a plasma-assisted physical vapor phase deposition method (PPD method), an atomic layer deposition method (ALD Method), and a migration enhanced epitaxy method (MEE method). To manufacture a red light emitting element, a green light emitting element, and a blue light emitting element, it is only required to select the above compound semiconductors and its compositions, as appropriate.

Here, in a case where the stack structure is formed with GaN-based compound semiconductors, the organic gallium source gas in the MOCVD method may be a trimethylgallium (TMG) gas or a triethylgallium (TEG) gas, for example, and the nitrogen source gas may be an ammonia gas or a hydrazine gas, for example. In the formation of a GaN-based compound semiconductor layer having the n-type conductivity, it is only required to add silicon (Si) as an n-type impurity (n-type dopant), for example. In the formation of a GaN-based compound semiconductor layer having the p-type conductivity, it is only required to add magnesium (Mg) as a p-type impurity (p-type dopant), for example. In a case where aluminum (Al) or indium (In) is contained as constituent atoms of a GaN-based compound semiconductor layer, a trimethylaluminum (TMA) gas may be used as the Al source, and a trimethylindium (TMI) gas may be used as the In source. Further, a monosilane gas ($SiH_4$ gas) may be used as the Si source, and a bis-cyclopentadienylmagnesium gas, methylcyclopentadienylmagnesium, or bis-cyclopentadienylmagnesium ($Cp_2Mg$) may be used as the Mg source. Note that examples of n-type impurities (n-type dopants) include Ge, Se, Sn, C, Te, S, O, Pd, and Po, as well as Si, and examples of p-type impurities (p-type dopants) include Zn, Cd, Be, Ca, Ba, C, Hg, and Sr, as well as Mg.

In a case where the first conductivity type is the n type, and the second conductivity type is the p type, the first electrode is an n-side electrode, and the second electrode is a p-side electrode. In a case where the first conductivity type is the p type, and the second conductivity type is the n type, on the other hand, the first electrode is a p-side electrode, and the second electrode is an n-side electrode. The first electrode and the second electrode can be formed by a PVD method such as a vacuum vapor deposition method or a sputtering method, for example. In the description below, the first conductivity type is the n type, and the second conductivity type is the p type.

The first electrode preferably has a single-layer configuration or a multilayer configuration including at least one metal (or alloy) selected from the group consisting of gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), and indium (In), for example. Specific examples of the single-layer configuration or the multilayer configuration include Ti/Au, Ti/Al, Ti/Al/Au, Ti/Pt/Au, Ni/Au, AuGe/Ni/Au, AuGe/Ni/ (Au/)Ti/Pt/Au, AuGe/Ni/(Ti/)TiW/Pt/Au, Ni/Au/Pt, Ni/Pt, Pd/Pt, Pd/AuGe, Ag/Pd, and Ti. Note that a layer shown before "/" in a multilayer configuration is located closer to the active layer side.

Meanwhile, examples of the second electrode include Au/AuZn, Au/Pt/Ti(/Au)/AuZn, Au/Pt/TiW(/Ti) (/Au)/AuZn, Au/AuPd, Au/Pt/Ti (/Au)/AuPd, Au/Pt/TiW(/Ti) (/Au)/AuPd, Au/Pt/Ti, Au/Pt/TiW(/Ti), Au/Pt/TiW/Pd/TiW (/Ti), Ti/Cu, Pt, Ni, Ag, and Ge. Note that a layer before "/" is located at a position electrically farther from the active layer. Alternatively, the second electrode may be formed with a transparent conductive material such as indium tin oxide (ITO, Sn-doped $In_2O_3$, crystalline ITO, or amorphous ITO), indium zinc oxide (IZO), indium gallium oxide (IGO), indium-doped gallium zinc oxide (IGZO, or In—$GaZnO_4$), IFO (F-doped $In_2O_3$), ITiO (Ti-doped $In_2O_3$), InSn, InSnZnO, a tin-based transparent conductive material [specifically, tin oxide ($SnO_2$), ATO (Sb-doped $SnO_2$), or FTO (F-doped $SnO_2$), for example], a zinc-based transparent conductive material [specifically, zinc oxide (ZnO, Al-doped ZnO (AZO), or B-doped ZnO), gallium-doped zinc oxide (GZO), or AlMgZnO (aluminum oxide and magnesium-oxide-doped zinc oxide), for example], or NiO.

A first pad portion may be formed on (a surface of) the first electrode, and a second pad portion may be formed on (a surface of) the second electrode. A pad portion preferably has a single-layer configuration or a multilayer configuration containing at least one metal selected from the group consisting of titanium (Ti), aluminum (Al), platinum (Pt), gold (Au), nickel (Ni), and palladium (Pd). Alternatively, a pad portion may have a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, or a Ti/Ni/Au/Cr/Au multilayer configuration, for example. In a case where the first electrode is formed with an Ag layer or an Ag/Pd layer, a cover metal layer formed with Ni/TiW/Pd/TiW/Ni is formed on a surface of the first electrode, for example, and a pad portion having a Ti/Ni/Au multilayer configuration or a Ti/Ni/Au/Cr/Au multilayer configuration can be formed on the cover metal layer, for example.

The side surfaces or the exposed surface of the stack structure may be covered with a coating layer (an insulating film). The coating layer (insulating film) can be formed on the basis of a known method. The refractive index of the material forming the coating layer (insulating film) is preferably lower than the refractive index of the material forming the stack structure. Examples of the insulating material forming the coating layer (insulating film) include $SiO_X$-based materials including $SiO_2$, $SiN_X$-based materials, $SiO_YN_Z$-based materials, $TaO_X$, $ZrO_X$, $AlN_X$, $AlO_X$, and $GaO_X$. Alternatively, such examples may include organic materials such as polyimide resins. The method for forming the coating layer (insulating film) may be a PVD method such as a vacuum vapor deposition method or a sputtering method, a CVD method, or a coating method, for example.

Examples of light emitting element manufacturing substrates designed for manufacturing light emitting elements may include a GaAs substrate, a GaP substrate, an AlN substrate, an AlP substrate, an InN substrate, an InP substrate, an AlGaInN substrate, an AlGaN substrate, an AlInN substrate, a GaInN substrate, an AlGaInP substrate, an AlGaP substrate, an AlInP substrate, a GaInP substrate, a ZnS substrate, a sapphire substrate, a SiC substrate, an alumina substrate, a ZnO substrate, a LiMgO substrate, a $LiGaO_2$ substrate, a $MgAl_2O_4$ substrate, a Si substrate, a Ge substrate, and those having an underlayer and a buffer layer formed on surfaces (principal surfaces) of these substrates. Note that, to manufacture a red light emitting element, a green light emitting element, and a blue light emitting element, it is only required to select appropriate substrates from among these substrates. It is known that the characteristics of a GaN substrate change to polar, non-polar, or semi-polar characteristics, depending on the growth surface. However, any principal surface (a second surface) of a GaN substrate can be used for forming a compound semiconductor layer. Further, regarding the principal surfaces of a GaN substrate, crystal orientation planes called A-plane, B-plane, C-plane, R-plane, M-plane, N-plane, S-plane, and the like, or planes formed by tilting these planes in a specific direction, or the like can also be used, depending on the crystal structure (of a cubic type, a hexagonal type, or the like, for example). Alternatively, a substrate may be formed with a GaN substrate having a {20-21} plane that is a semi-polar surface as a principal surface (a GaN substrate whose principal surface is a surface having the c-plane tilted by about 75 degrees in an m-axis direction).

In the stack structure forming a light emitting element in a light emitting element assembly of the present disclosure, a conductive light emitting element manufacturing substrate is left on, with the first compound semiconductor layer formed on one surface of the light emitting element manufacturing substrate in some cases. In other cases, the light emitting element manufacturing substrate is removed after a light emitting element is formed on the light emitting element manufacturing substrate. Further, in the former case, the first electrode is formed on the other surface of the conductive light emitting element manufacturing substrate. In the latter case, the first electrode is formed on the first compound semiconductor layer. In a multi-beam laser chip assembly and a stereolithographic apparatus of the present disclosure, a conductive light emitting element manufacturing substrate is left on, with the first compound semiconductor layer formed on one surface of the light emitting element manufacturing substrate. The first electrode is then formed on the other surface of the conductive light emitting element manufacturing substrate, and the first electrode is shared (common) by a plurality of light emitting element assemblies. The second compound semiconductor layer side preferably faces the light emitting element drive unit, from the viewpoint of heat dissipation and simplicity of the electrode configuration. Further, in this case, the electrode provided on a light emitting element to which a first joining member is connected is the second electrode.

First Embodiment

Figure 1B:
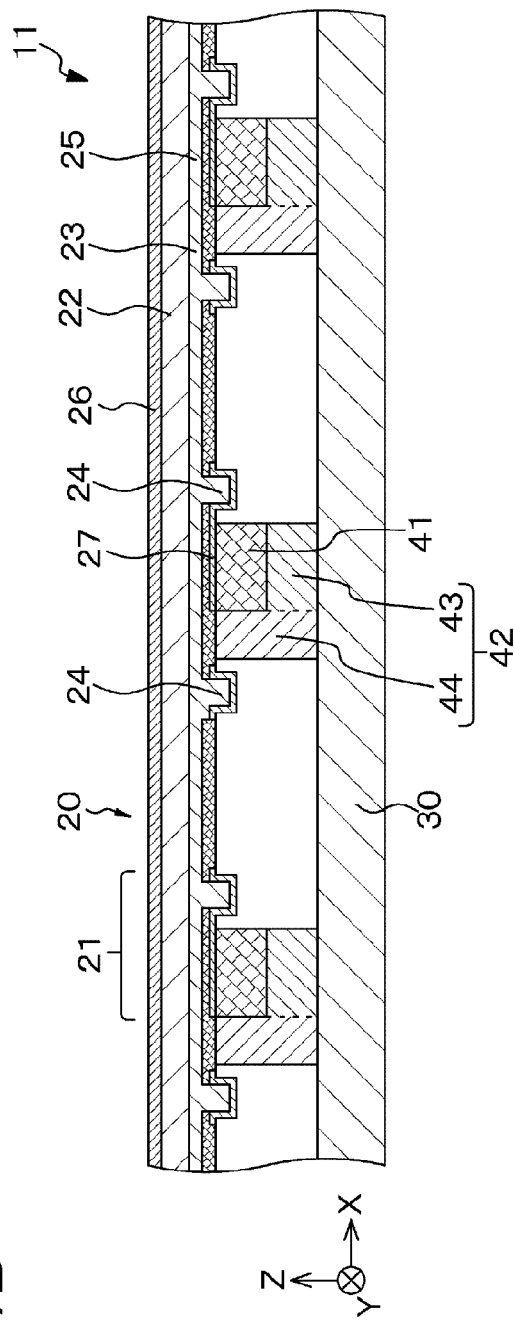

A first embodiment relates to a light emitting element assembly and a multi-beam laser chip assembly, and a member assembly and a method for manufacturing the member assembly according to the present disclosure. FIGS. 1A and 1B show schematic partial cross-sectional views of the light emitting element assembly, the multi-beam laser chip assembly, and the member assembly of the first embodiment. FIGS. 2A and 2B are partial layout diagrams schematically showing the layout of the components of the light emitting element assembly, the multi-beam laser chip assembly, and the member assembly of the first embodiment. Note that FIGS. 1A and 1B are schematic partial cross-sectional views taken along the arrows A-A and the arrows B-B defined in FIGS. 2A and 2B. Further, in a portion of FIG. 2A, and in a portion of FIG. 9, a portion of FIG. 10B, and a portion of FIG. 11 described later, the regions of light emitting elements are surrounded by dot-and-dash lines.

A light emitting element assembly 20 of the first embodiment includes:
- a light emitting element 21;
- a light emitting element drive unit 30 (specifically, a submount 160 described later);
- a first joining member 41 connected to an electrode provided on the light emitting element 21 (specifically, a second electrode 27 described later); and
- a second joining member 42 provided on the light emitting element drive unit 30. Further,
- one of the first joining member 41 and the second joining member 42 (specifically, the second joining member 42 in the first embodiment) includes an alloy material,
- the other one of the first joining member and the second joining member (specifically, the first joining member 41 in the first embodiment) includes a metallic material,
- the joining member including an alloy material (the second joining member 42) is formed with a first portion 43 and a second portion 44, the joining member including a metallic material (the first joining member 41) and the first portion 43 are joined to each other, and, between the light emitting element 21 and the light emitting element drive unit 30, the second portion 44 is disposed on one of the light emitting element 21 and the light emitting element drive unit 30 (specifically, the light emitting element drive unit 30 in the first embodiment), and is in contact with the other one of the light emitting element and the light emitting element drive unit (specifically, the light emitting element 21 in the first embodiment).

A multi-beam laser chip assembly 11 of the first embodiment is formed with a plurality of light emitting element assemblies that are arranged in parallel, and each light emitting element assembly is formed with a light emitting element assembly 20 of the first embodiment. Specifically, a light emitting element 21 includes a laser element (an end-emitting semiconductor laser element) that emits light from its end face.

A member assembly of the first embodiment includes:
a first member 21;
a second member 30;
a first joining member 41 provided on the first member 21; and
a second joining member 42 provided on the second member 30,
in which
the first joining member 41 includes a metallic material,
the second joining member 42 includes an alloy material,
the second joining member 42 is formed with a first portion 43 and a second portion 44,
the first joining member 41 and the first portion 43 are joined to each other, and
the second portion 44 is disposed between the first member 21 and the second member 30, and is in contact with the first member 21.

Further, in the light emitting element assembly 20 of the first embodiment, the second portion 44 is disposed next to the first portion 43. That is, a side surface of the second portion 44 is in contact with a side surface of the first portion 43. Where the height of the first portion is represented by $H_1$, and the height of the second portion is represented by $H_2$, $H_1 < H_2$ is satisfied.

The alloy material forming the second joining member 42 contains atoms forming the metallic material forming the first joining member 41. The first portion 42 and the joining member including a metallic material (the first joining member 41) are joined to each other, on the basis of the eutectic crystal accompanied by diffusion of atoms forming the metallic material. Specifically, the alloy material is formed with a gold-tin (Au—Sn) solder material, and the metallic material is formed with gold (Au). In some cases, part of the first joining member 41 including the surface (the opposing surface) of the first joining member 41 facing the second joining member 42 includes gold (Au). Further, the melting point $MP_1$ of the alloy material forming the region of the first portion 43 adjacent to the first joining member 41 is lower than the melting point $MP_2$ of the alloy material forming the second portion 44. The composition of the alloy material forming the region of the first portion 43 adjacent to the first joining member 41 is different from the composition of the alloy material forming the second portion 44. Specifically, the tin content of the alloy material that is formed with a gold-tin (Au—Sn) solder material and forms the region of the first portion 43 adjacent to the first joining member 41 is 18% by mass to 29% by mass, or more specifically, is 20% by mass, for example. The tin content of the alloy material that is formed with a gold-tin (Au—Sn) solder material and forms the second portion 44 is smaller than 18% by mass or greater than 29% by mass, or specifically, is 30% by mass, for example. The melting point $MP_1$ of the alloy material forming the region of the first portion 43 adjacent to the first joining member 41 is 280° C., and the melting point $MP_2$ of the alloy material forming the second portion 44 is 400° C. Before the first joining member 41 and the first portion 43 are joined, the second portion 44 and the first portion 43 have the same composition. Accordingly, the melting point of the alloy material forming the second portion 44 and the first portion 43 is $MP_2$. On the other hand, after the first joining member 41 and the first portion 43 are joined, the region of the first portion 43 adjacent to the first joining member 41 and the second portion 44 have different compositions as described above.

Where the cross-sectional area of the first portion 43 is represented by $S_1$ and the cross-sectional area of the second portion 44 is represented by $S_2$ when cut in a virtual plane orthogonal to the thickness direction, the following relationship is satisfied:

$$S_1/(S_1+S_2)<1$$

or preferably, $$0.5 \le S_1/(S_1+S_2) \le 0.9$$

Specifically, the relationship is $$S_1/(S_1+S_2)=0.8$$

Where the cross-sectional area of the joining member including a metallic material (the first joining member 41) when cut in a virtual plane orthogonal to the thickness direction is represented by $S_3$, $S_1 > S_3$ is satisfied in some cases, and $S_1 = S_3$ or $S_1 < S_3$ is satisfied in other cases, as shown in FIGS. 2A and 2B. Further, a light emitting element is formed with an end-emitting semiconductor laser element. The light reflectance of the light emitting portion (the front end face) is preferably not lower than 5% and not higher than 90%, and the light reflectance of the surface facing the light emitting portion (the back end face) is preferably not lower than 60% but lower than 100%.

In the multi-beam laser chip assembly 11 of the first embodiment,
the number of light emitting element assemblies constituting the multi-beam laser chip assembly 11 is 2N (N is an integer of 2 or greater), and N≥25, for example, and,
where n is an integer that is not smaller than 1 and not greater than N, the first joining member 41 and the second joining member 42 are disposed between the light emitting portion of the (2n−1)th light emitting element and the light emitting portion of the 2nth light emitting element, but are not disposed between the light emitting portion of the 2nth light emitting element and the light emitting portion of the (2n+1)th light emitting element, so that the pitch of the light emitting elements can be narrowed. Note that an aggregate of the 2N light emitting elements is sometimes referred to as a multi-beam laser chip 12.

The distances between the light emitting portions of the light emitting elements 21 is not shorter than 10 µm and not longer than 100 µm, preferably is 50 µm or shorter, or specifically, is 20 µm, and the distances between the light emitting portions of the light emitting elements 21 are equal.

Specifically, the light emitting element drive unit 30 is formed with a submount, or is formed with a semiconductor substrate having a light emitting element drive circuit formed therein.

In the description below, a method for manufacturing a light emitting element assembly of the first embodiment, and a method for manufacturing a member assembly of the first embodiment are explained.

First, the first member (specifically, the light emitting element) 21 having the first joining member 41 of a metallic material provided thereon, and the second member (specifically, the light emitting element drive unit) 30 that is formed with the first portion 43 and the second portion 44 and has a second joining member 42' of an alloy material provided thereon are prepared (see a schematic partial cross-sectional view in FIG. 3).

Figure 4A:
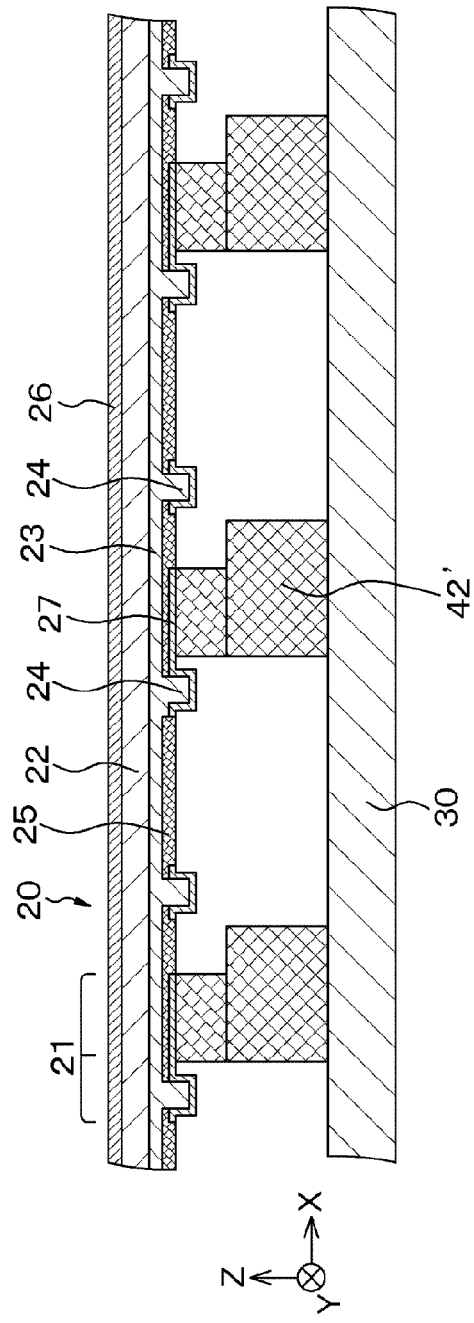
FIG. 4A and FIG. 4B are schematic partial cross-sectional views of a light emitting element assembly and the like for explaining the method for manufacturing the light emitting element assembly, the multi-beam laser chip assembly, and the member assembly of the first embodiment, continuing from FIG. 3.

With the first portion 43 of the second joining member 42 and the first joining member 41 being in contact with each other, pressure is then applied between the first member 21 and the second member 30 with an appropriate means (a collet, for example) (see a schematic partial cross-sectional view in FIG. 4A).

Figure 4B:
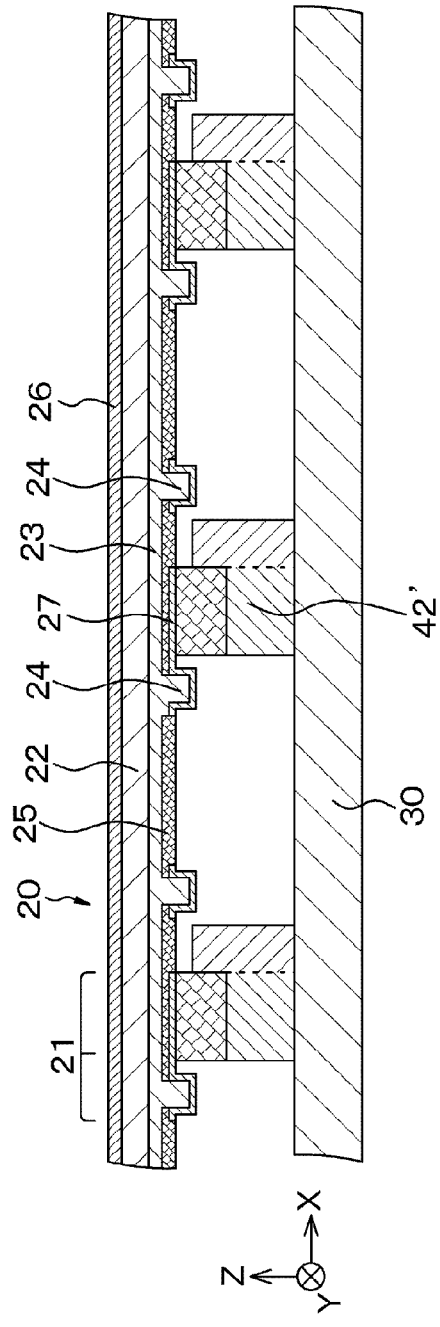

The first joining member 41 and the second joining member 42 are then heated, so that the first portion 43 is melted and is joined to the first joining member 41, and the second portion 44 is brought into contact with the first member 21. Specifically, a collet is used to heat the first joining member 41 and the second joining member 42 to $(MP_2-\Delta T)°$ C. Here, $\Delta T$ is preferably 10° C. to 100° C. Because the alloy material is formed with a gold-tin solder material, and the metallic material is formed with gold (in some cases, part of the first joining member 41 including the surface (the opposing surface) of the first joining member 41 facing the second joining member 42 is formed with gold (Au)), which means that the alloy material contains atoms forming the metallic material, the first portion 43 in contact with the first joining member 41 has diffusion of the atoms forming the metallic material from the first joining member 41. As a result, the melting point of the first portion 43 becomes lower. In the end, the region of the first portion 43 adjacent to the first joining member 41, and the first joining member 41 are joined to each other on the basis of eutectic crystal (see schematic partial cross-sectional views in FIG. 4B, and FIGS. 1A and 1B). As described above, the eventual composition of the first portion 43 joined to the first joining member 41 on the basis of eutectic crystal is 80% by mass of gold and 20% by mass of tin. On the other hand, the composition of the second portion 44 remains 70% by mass of gold and 30% by mass of tin.

Figure 5A:
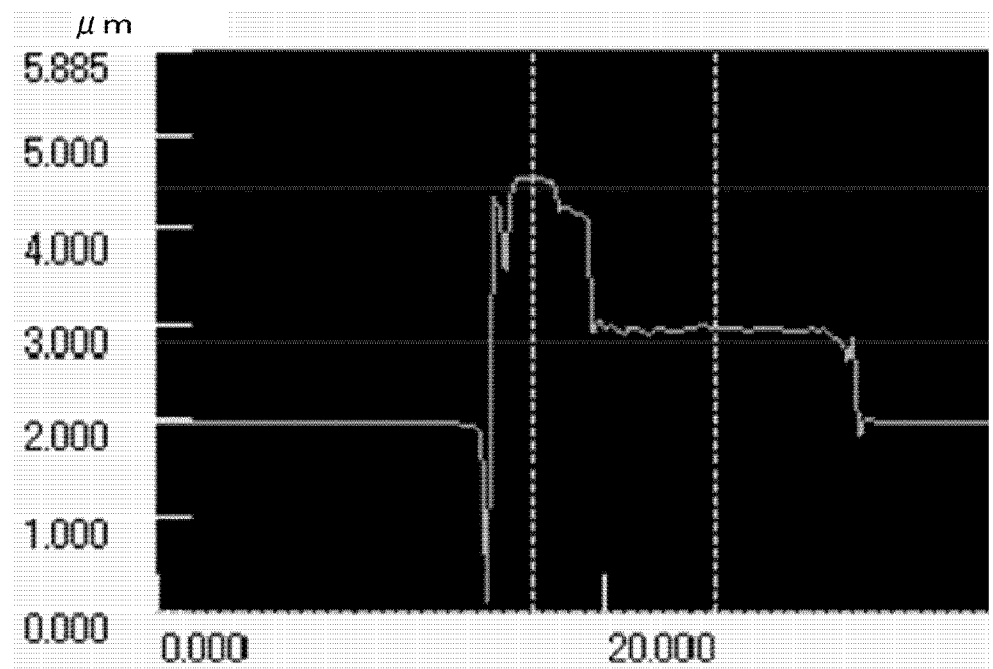
FIG. 5A is a graph showing the results of analysis conducted on a first joining member and a second joining member that have been joined in one light emitting element of the first embodiment.
Figure 5B:
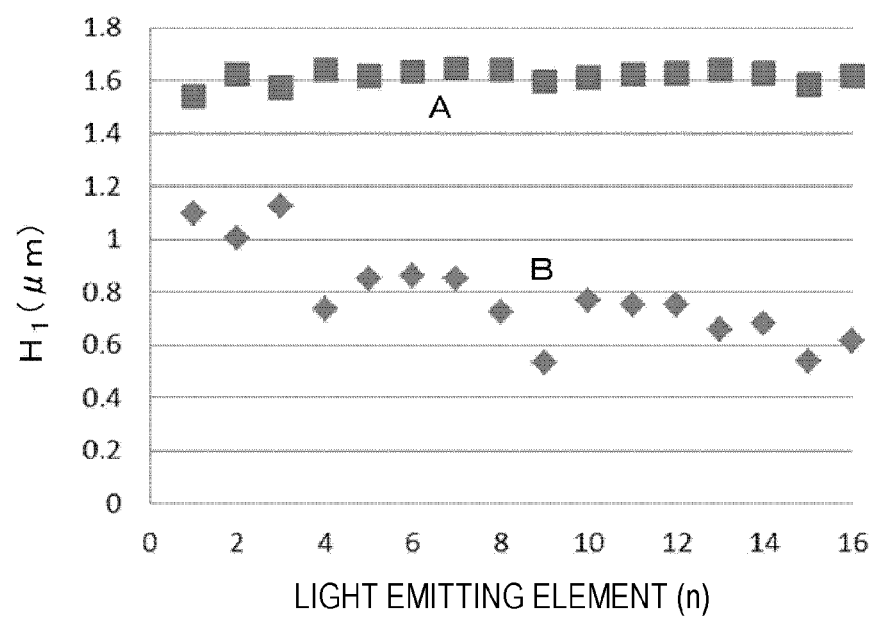
FIG. 5B is a graph showing the results of measurement of the heights $H_1$ of the first joint members of sixteen light emitting elements after the joining.
Figure 6A:
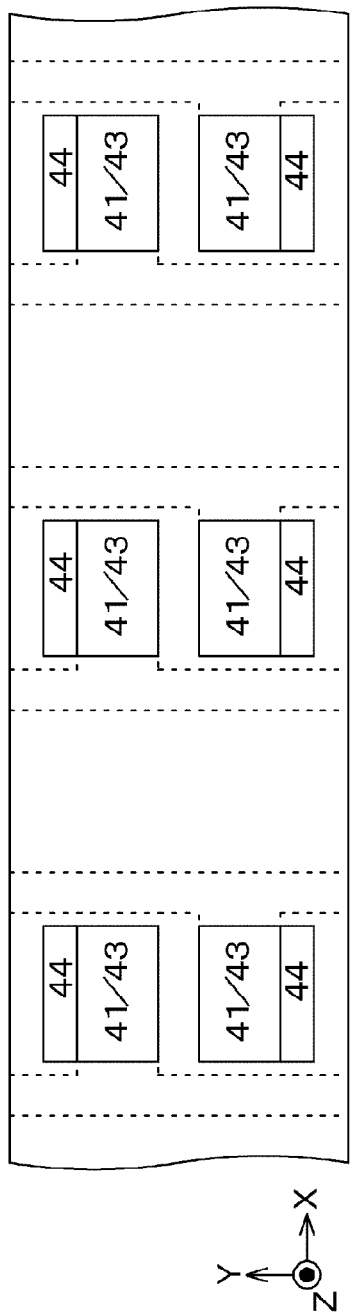
FIG. 6A and FIG. 6B are partial layout diagrams schematically showing the layouts of the components of Modification-1 and Modification-2, respectively, of the light emitting element assembly, the multi-beam laser chip assembly, and the member assembly of the first embodiment.
Figure 6B:
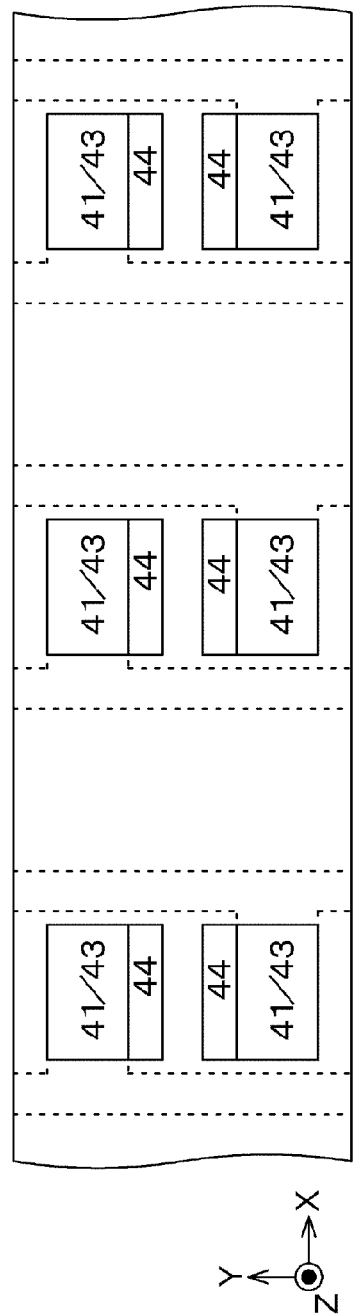
Figure 7A:
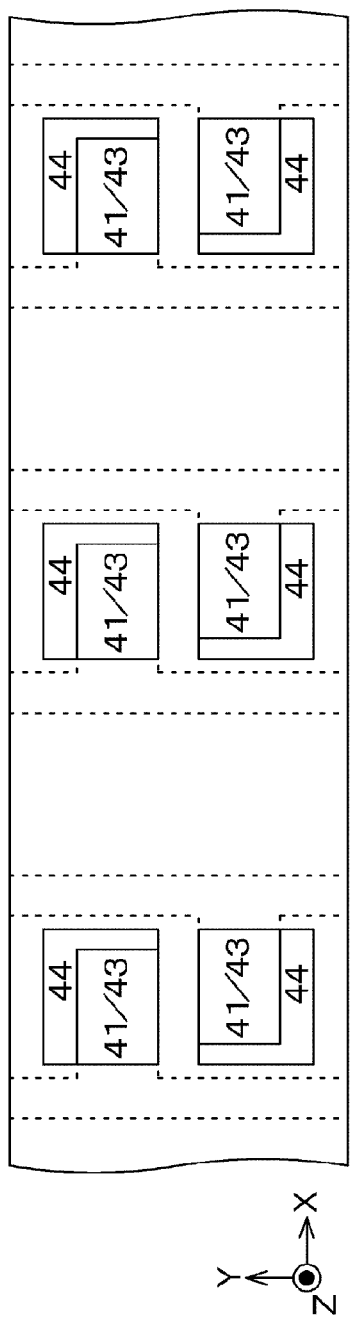
FIG. 7A and FIG. 7B are partial layout diagrams schematically showing the layouts of the components of Modification-3 and Modification-4, respectively, of the light emitting element assembly, the multi-beam laser chip assembly, and the member assembly of the first embodiment.
Figure 7B:
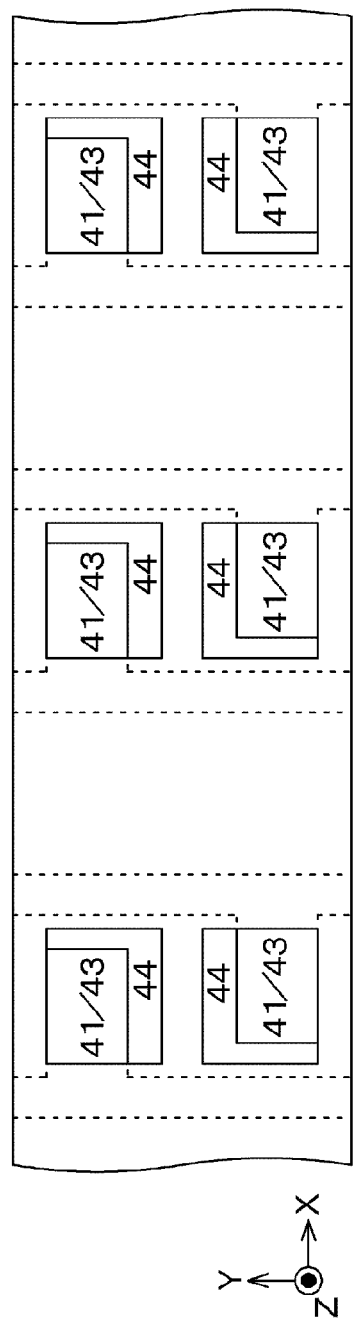
Figure 8A:
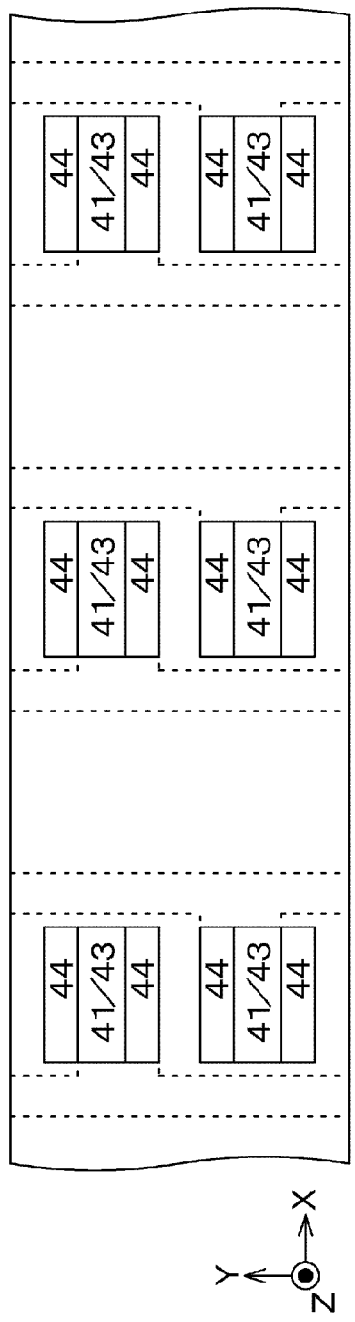
FIG. 8A and FIG. 8B are partial layout diagrams schematically showing the layouts of the components of Modification-5 and Modification-6, respectively, of the light emitting element assembly, the multi-beam laser chip assembly, and the member assembly of the first embodiment.
Figure 8B:
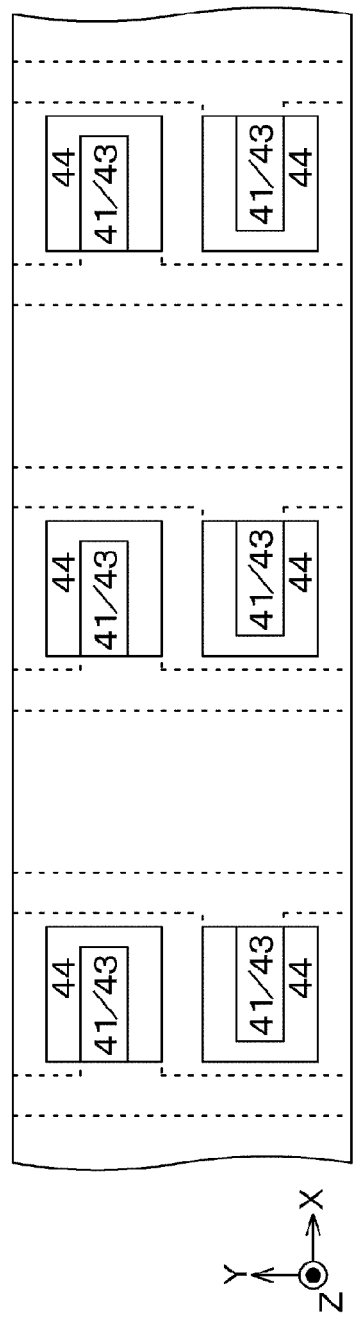

The height of the first joining member 41 (including its pad portion not shown) before the joining was 1.65 µm, and the height of the second joining member 42 (including its pad portion not shown) before the joining was 2.40 µm. A multi-beam laser chip 12 in which sixteen light emitting elements 21 were arrayed was prepared. A light emitting element assembly was then manufactured on the basis of the above described method for manufacturing a light emitting element assembly. FIG. 5A shows the results of analysis conducted on a first joining member 41 and a second joining member 42 to which one light emitting element is joined. That is, FIG. 5A shows the interface between the second portion 44 and the first member 21, and the interface between the first portion 43 and the first joining member 41. The ordinate axis of FIG. 5A indicates the height (unit: µm) of these components, and the abscissa axis of FIG. 5A indicates the position of the second joining member 42 in the X direction. Also, the results of measurement of the height $H_1$ of the first joining member 41 after joining of the sixteen light emitting elements 21 are shown in "A" of FIG. 5B. For reference, "B" of FIG. 5B shows the results of measurement of the height of a first joining member 41 in a light emitting element assembly obtained in a state in which no pressure is applied between the first member 21 and the second member 30 while the first portion 43 of the second joining member 42 is in contact with the first joining member 41. Note that the abscissa axis of FIG. 5B indicates the array of the sixteen light emitting elements, and the ordinate axis of FIG. 5B indicates the height $H_1$ (unit: µm) of the first joining member 41 after the joining of the sixteen light emitting elements 21. Also, regarding "B" of FIG. 5B, the ordinate axis of FIG. 5B indicates the penetration depth of the first joining member 41 into the second portion 44. As can be seen from FIG. 5B, the height $H_1$ of the first joining member 41 in the light emitting element assembly obtained by applying pressure between the first member 21 and the second member 30 is uniform, and furthermore, the height of the first joining member 41 hardly changes before and after the joining.

FIGS. 6A, 6B, 7A, 7B, 8A, and 8B show partial layout diagrams schematically showing the layouts of the components of Modification-1, Modification-2, Modification-3, Modification-4, Modification-5, and Modification-6 of the light emitting element assembly, the multi-beam laser chip assembly, and the member assembly of the first embodiment. In the example shown in FIG. 2B, the first portion 43 and the second portion 44 are arrayed in the X direction. On the other hand, in Modification-1, Modification-2, and Modification-5 shown in FIGS. 6A, 6B, and 8A, the first portion 43 and the second portion 44 are arrayed in the Y direction. Further, in Modification-3 and Modification-4 shown in FIGS. 7A and 7B, the second portion 44 is in contact with two side surfaces of the first portion 43 and the first joining member 41. In Modification-6 shown in FIG. 8B, the second portion 44 is in contact with three side surfaces of the first portion 43 and the first joining member 41.

As mentioned above, there is no change in the composition of the second portion. That is, the height of the second portion remains $H_2$. Accordingly, in the multi-beam laser chip assembly obtained by such a method for manufacturing a light emitting element assembly of the first embodiment and by such a method for manufacturing a member assembly of the first embodiment, the distance between the light emitting elements and the light emitting element drive unit in the light emitting element assembly can be defined by the height $H_2$ of the second portion. Thus, even if warpage occurs in a multi-beam laser chip during the manufacturing or assembling of the multi-beam laser chip, it is possible to correct the warpage in the multi-beam laser chip in a multi-beam laser chip assembly. That is, it is possible to provide a light emitting element assembly that can prevent warpage despite its simple configuration and structures, and a multi-beam laser chip assembly and a member assembly.

Moreover, the first joining member and the second joining member are formed with materials having high thermal conductivity and electric conductivity, such as gold and a gold-tin solder material. With this arrangement, the electric conductivity from the light emitting elements to the light emitting element drive unit is high, and the thermal conductivity is high when the heat generated in the light emitting elements is released to the light emitting element drive unit.

Figure 12:
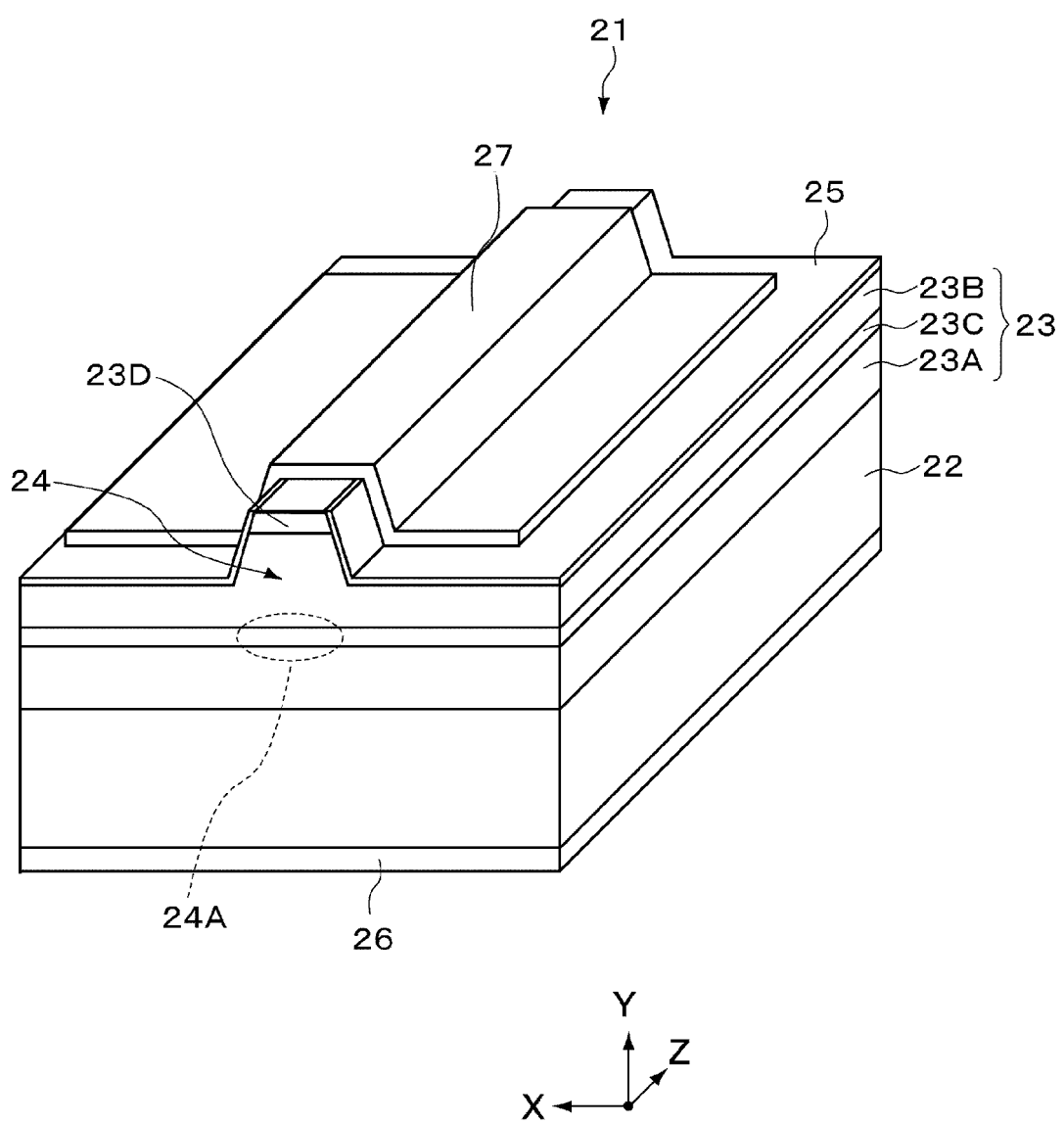
FIG. 12 is a schematic perspective view of a light emitting element (a laser element).

FIG. 12 shows a schematic perspective view of a light emitting element (a laser element) in a multi-beam laser chip. Note that, between FIGS. 1A and 1B and FIG. 12, the positional relationship in the vertical direction in a light emitting element is reversed.

A light emitting element 21 includes a substrate 22 formed with a GaN substrate, a stack structure 23 formed on one surface of the substrate 22, and a contact layer 23D including GaN, for example. The stack structure 23 includes, from the substrate side, a first compound semiconductor layer 23A formed with AlGaN, for example, a light emitting layer (an active layer) 23C having a multiple quantum well structure (MQW structure) formed with GaInN having different composition ratios in the well layer and the barrier layer, and a second compound semiconductor layer 23B formed with AlGaN, for example. A ridge portion (an optical waveguide) 24 is formed so as to protrude from the second compound semiconductor layer 23B. The ridge portion 24 is part of the stack structure 23 (specifically, part of the second compound semiconductor layer 23B). At the ridge portion, light confinement in the X direction is performed by taking advantage of the difference in refractive index in the X direction, and the current to be injected into the stack structure 23 is narrowed. Of the light emitting layer 23C, one end face of the ridge portion 24 is a light emitting region 24A. As described above, the light emitting element (laser element) 21 has a structure in which the strip-shaped ridge portion 24 long in the Z direction is sandwiched between the front end face and the back end face in the resonator direction (Z direction). That is, as described above, the light emitting element (laser element) 21 is an end-emitting semiconductor laser.

The light emitting portion (the front end face 24A) of the light emitting element 21 is the face from which light is emitted, and a multilayer reflective film (not shown) is formed on the light emitting portion. The surface (the back end face) facing the light emitting portion is the surface by which light is reflected, and a multilayer reflective film (not shown) is also formed on this surface. The light reflectance of the multilayer reflective film on the light emitting portion (the front end face) is about 10%, for example. The reflectance of the multilayer reflective film on the surface (the back end face) facing the light emitting portion is about 95%, for example.

A first electrode 26 is formed on the other surface of the substrate 22. The first electrode 26 is shared (common) by a plurality of light emitting elements 21. A second electrode 27 is formed on the surface of the ridge portion 24 (the surface of the contact layer 23D) so as to cover the entire ridge portion 24, and the second electrode 27 is in contact with the contact layer 23D. Note that an insulating layer 25 is formed on the stack structure 23 excluding the contact layer 23D. The insulating layer 25 includes $SiO_2$, SiN, $ZrO_2$, or the like, for example.

As the joint portion between the first joining member 41 and the second joining member 42 is located away from the light emitting region 24A as described above, stress is not easily generated in the stack structure 23, and thus, degradation of light emitting characteristics due to such stress can be reduced.

Second Embodiment

Figure 10A:
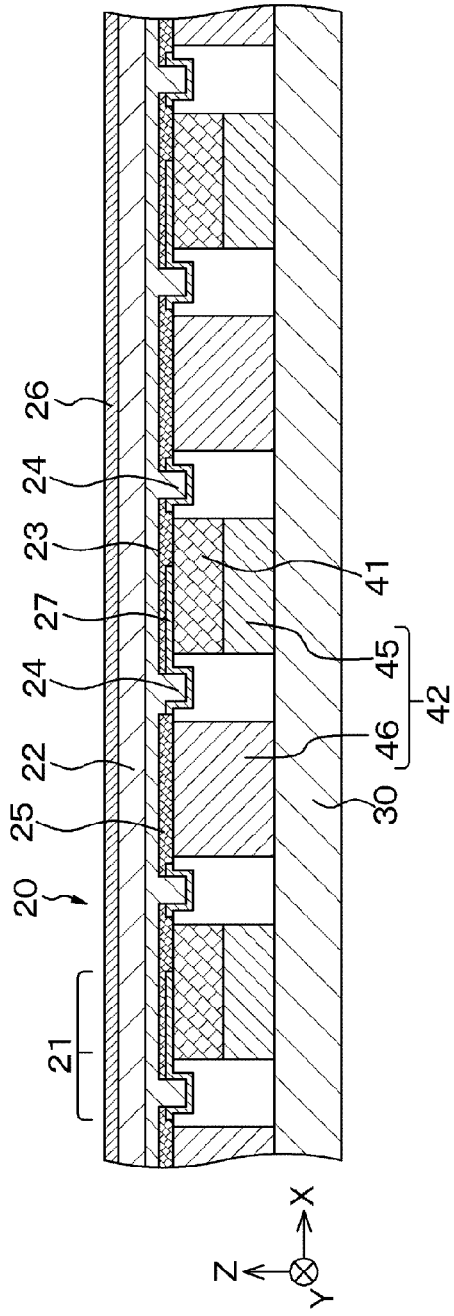
FIG. 10A is a schematic partial cross-sectional view of Modification-1 of the light emitting element assembly, the multi-beam laser chip assembly, and the member assembly of the second embodiment.
Figure 10B:
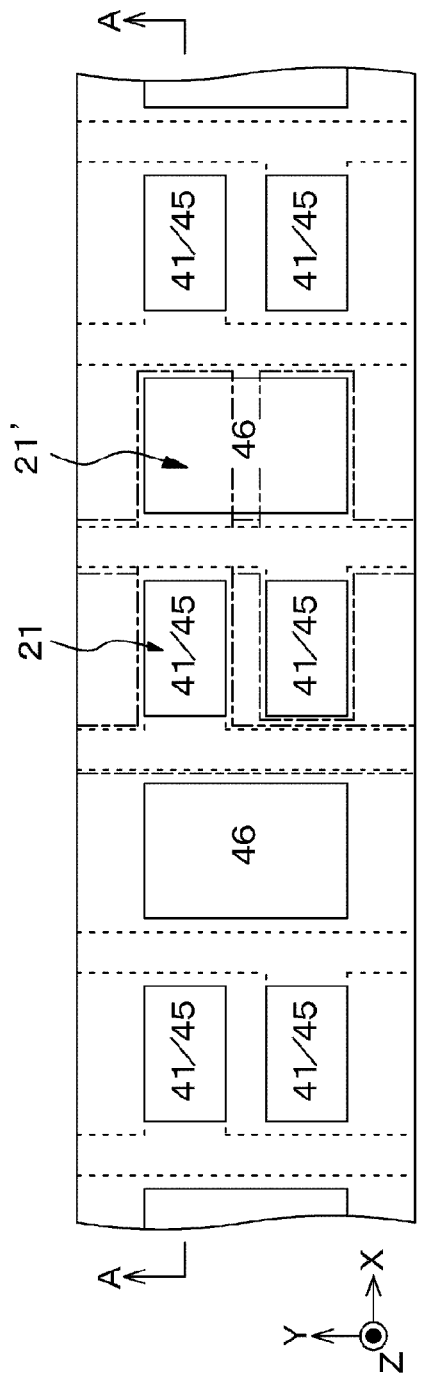
FIG. 10B is a partial layout diagram schematically showing the layout of the components of Modification-1 of the second embodiment. Here.
Figure 11:
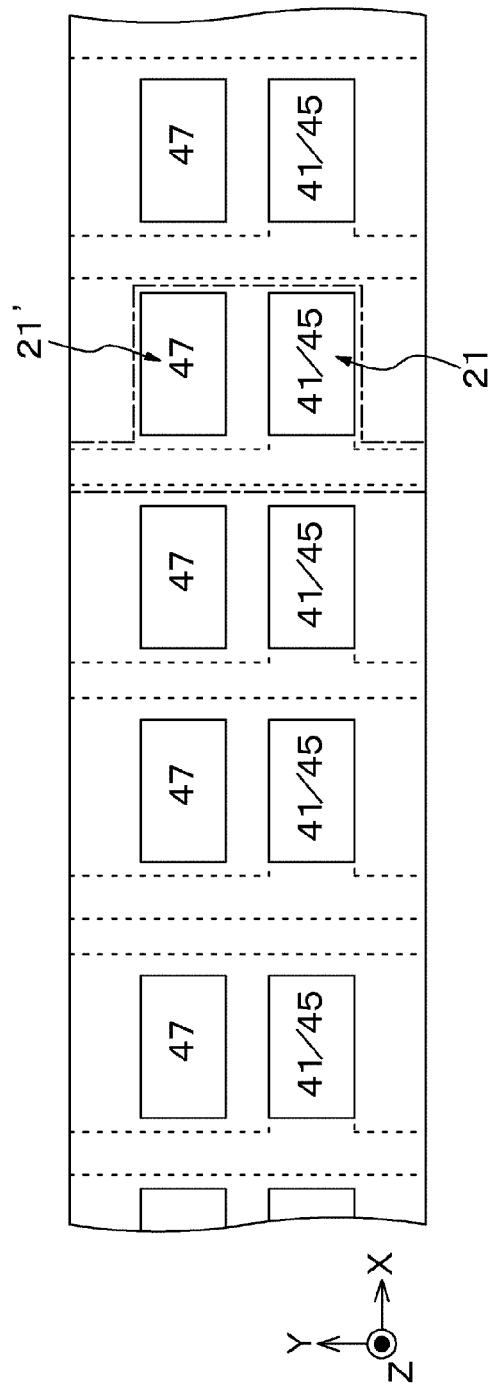
FIG. 11 is a partial layout diagram schematically showing the layout of the components of Modification-2 of the second embodiment.

A second embodiment is a modification of the first embodiment. FIG. 9 is a partial layout diagram schematically showing the layout of the components of a light emitting element assembly, a multi-beam laser chip assembly, and a member assembly of the second embodiment. FIG. 10A shows a schematic partial cross-sectional view of Modification-1 of the light emitting element assembly, the multi-beam laser chip assembly, and the member assembly of the second embodiment. FIG. 10B is a partial layout diagram schematically showing the layout of the components of Modification-1 of the second embodiment. Further, FIG. 11 is a partial layout diagram schematically showing the layout of the component of Modification-2 of the second embodiment. Here, FIG. 10A is a schematic partial cross-sectional view taken along the arrows A-A defined in FIG. 10B.

In a light emitting element assembly of the present disclosure of the second embodiment, a second portion 46 is disposed at a distance from a first portion 45. That is, any side surface of a second portion 46 is not in contact with any side surface of any first portion 45. In the example shown in FIG. 9, the first portions 45 are separated from the second portions 46 in the Y direction. In the example shown in FIGS. 10A and 10B, the first portions 45 are separated from the second portions 46 in the X direction. In the example shown in FIG. 11, the first portions 45 are separated from second portions 47 in the Y direction. Here, in the examples shown in FIGS. 9, 10A, 10B, and 11, between light emitting element extension portions 21' and the light emitting element drive unit 30, the second portions 46 are formed on the light emitting element drive unit 30, and are in contact with the light emitting element extension portions 21'. In the example shown in FIG. 11, a first joining member 41 and a second joining member 42 are disposed between the light emitting portion of the mth light emitting element and the light emitting portion of the (m+1)th light emitting element [here, m=1, 2, 3, . . . , (2N−1)]. In these cases, the material forming the second portion 46 and the first portion 45 before the joining is an Au—Sn solder material containing 70% by mass of gold and 30% by mass of tin, as in the first embodiment. However, the material is not limited to this, and the first portion 45 and the second portion 46 before the joining may include different materials or be formed with different compositions.

Except for the above aspects, the light emitting element assembly, the multi-beam laser chip assembly, and the member assembly of the second embodiment can have configurations and structures similar to those of the light emitting element assembly, the multi-beam laser chip assembly, and the member assembly of the first embodiment, and therefore, detailed explanation of them is not made herein.

Third Embodiment

Figure 13:
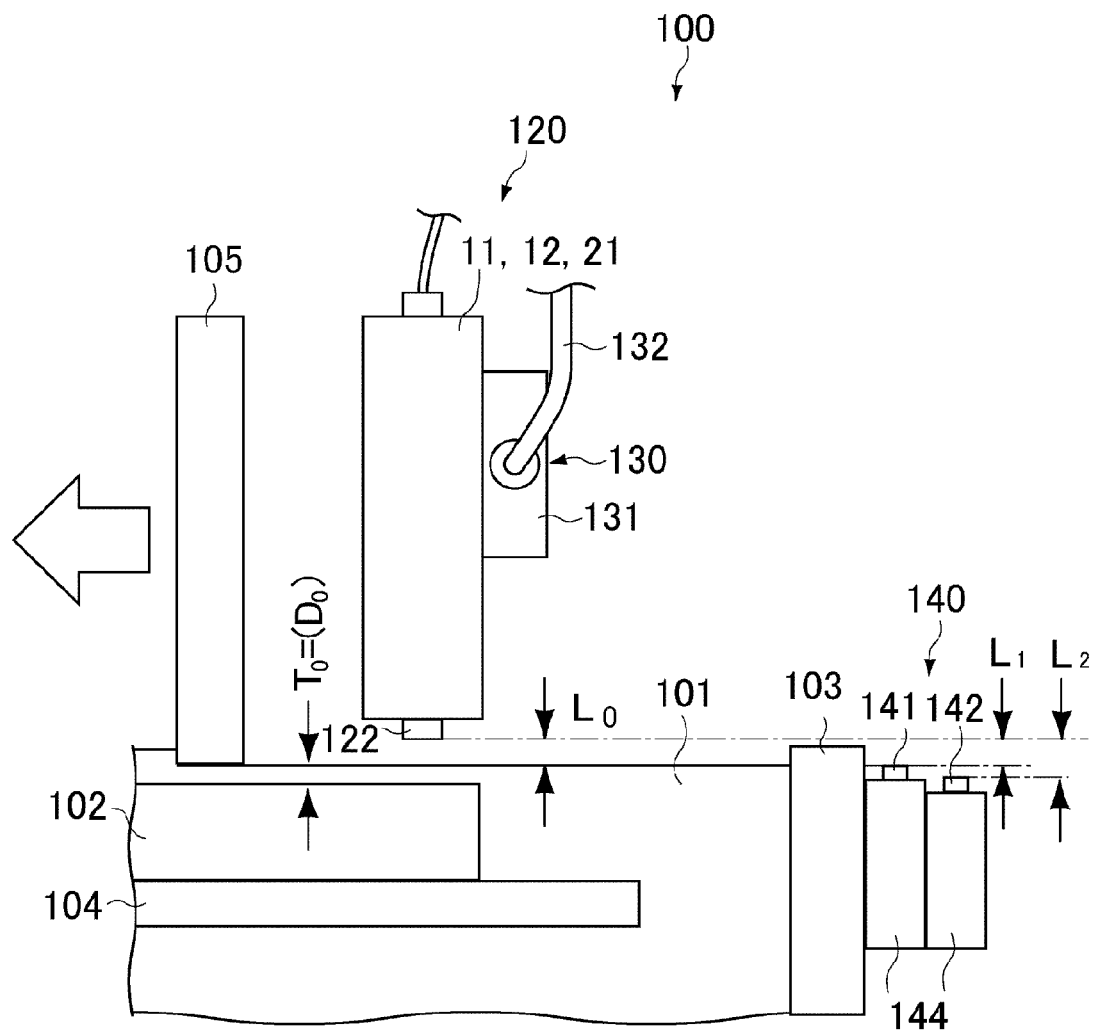
FIG. 13 is a side view of a stereolithographic apparatus of a third embodiment.
Figure 14:
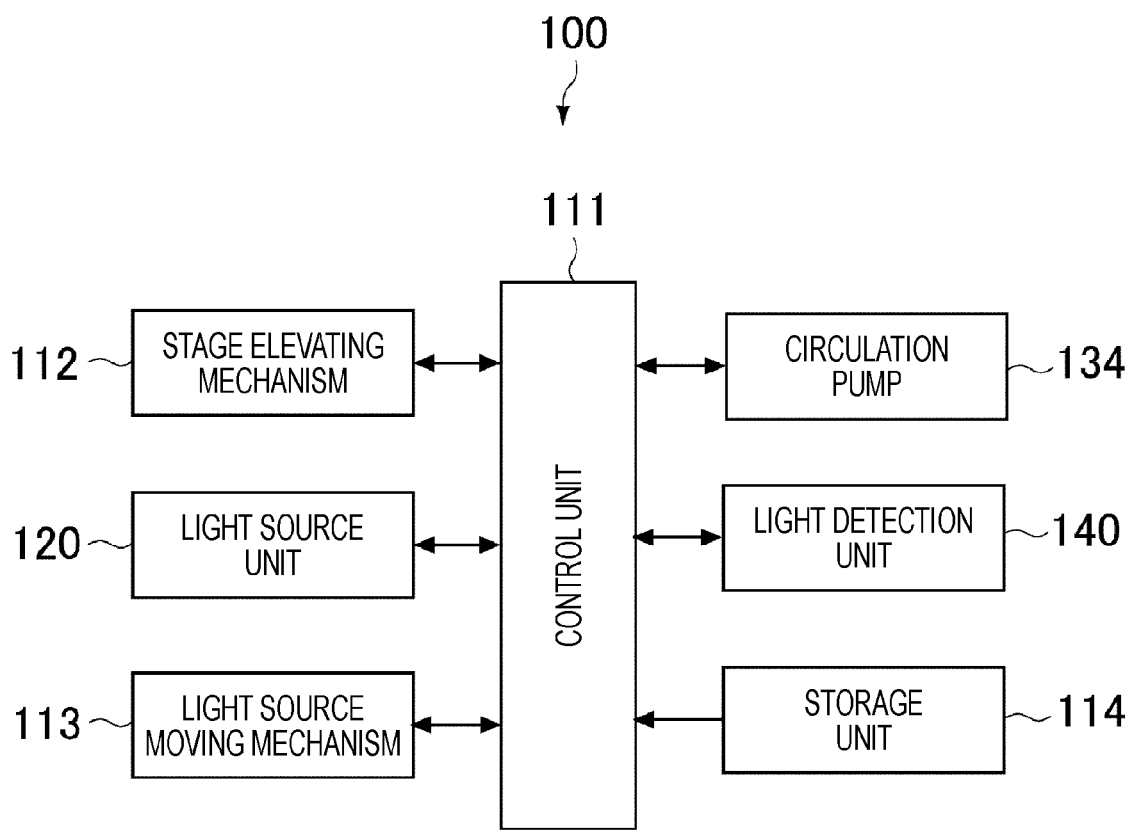
FIG. 14 is an electric block diagram of the stereolithographic apparatus of the third embodiment.

A third embodiment relates to a stereolithographic apparatus of the present disclosure. FIG. 13 shows a conceptual side view of a stereolithographic apparatus 100 of the third embodiment. FIG. 14 is an electric block diagram showing the stereolithographic apparatus 100.

The stereolithographic apparatus 100 of the third embodiment includes:
  the multi-beam laser chip assembly 11 described in the first and second embodiments; and
  a condensing member 122 that condenses light emitted from the multi-beam laser chip assembly 11,
in which
  the multi-beam laser chip assembly 11 is formed with a plurality of light emitting element assemblies that are aligned, and
  each light emitting element assembly is formed with the light emitting element assembly 20 described in the first and second embodiments.

Specifically, the stereolithographic apparatus 100 of the third embodiment includes:
- a resin tank 103 that stores a liquid photocurable resin 101;
- a stage 104 that is immersed in the photocurable resin 101 and supports a modeled object 102;
- a stage elevating mechanism 112 (see FIG. 14) that moves up and down the stage 104;
- a light source unit 120 that irradiates the photocurable resin 101 with light;
- a blade 105 that planarizes the surface of the photocurable resin 101;
- a light source moving mechanism 113 (see FIG. 14) that moves the light source unit 120 and the blade 105 in a horizontal direction (X-Y direction);
- a cooling mechanism 130 attached to the light source unit 120;
- a circulation pump 134 (see FIG. 14) that circulates water in the cooling mechanism 130;
- a light detection unit 140 that detects light emitted from the light source unit 120;
- a control unit 111 (see FIG. 14) that comprehensively controls the respective components of the stereolithographic apparatus 100; and
- a storage unit 114 (see FIG. 14) that stores various kinds of programs and data required for the processing to be performed by control unit 111.

The resin tank 103 is a container whose upper surface is open, and can store the liquid photocurable resin 101 therein. As the photocurable resin 101, an epoxy-based or urethane-based ultraviolet curable resin or the like is used, for example. However, a resin that is cured by light in another wavelength range such as visible light, and the material of the photocurable resin 101 is not limited to any particular material.

The stage 104 is a flat plate-like member, and supports the modeled object 102 formed by being cured by light emitted from the light source unit 120 from below. The stage elevating mechanism 112 can move the stage 104 in the vertical direction (Z direction). When the modeled object 102 is formed, the stage elevating mechanism 112 moves the stage 104 downward by a predetermined distance each time one layer of the modeled object 102 is formed. The distance to move the stage 104 downward is equal to the thickness $T_0$ of one layer of the modeled object 102, and is also equal to the exposure depth $D_0$ of the light source unit 120 with respect to the photocurable resin 101. The thickness $T_0$ of one layer and the exposure depth $D_0$ are 20 μm, but are not limited to this. For example, the thickness $T_0$ of one layer and the exposure depth $D_0$ can be selected between several tens of μm and several hundreds of μm, as appropriate.

The light source unit 120 irradiates the surface of the photocurable resin 101 (the surface planarized by the blade 105) with light while being moved in the scanning direction (Y direction) by the light source moving mechanism 113. Thus, the photocurable resin 101 is exposed (cured) layer by layer. The light source unit 120 includes a plurality of light emitting elements (laser elements) 21 (see FIG. 12) arrayed in the X direction, and the photocurable resin 101 is exposed in dots and is cured by light emitted from these light emitting elements 21.

The distance $L_0$ between the lower end face of the light source unit 120 (the lower end face of a convergent rod lens 122) and the (planarized) surface of the photocurable resin 101 is set at 2 mm, for example. However, the distance $L_0$ can be changed as appropriate. The height of the light source unit 120 is adjusted so that the focal position of light to be emitted from the light source unit 120 is a position at a distance of several μm to several tens of μm from the (planarized) surface of the photocurable resin 101. The configuration of the light source unit 120 will be described later in detail.

The blade 105 is disposed on the front side (the left side in FIG. 13) of the light source unit 120 in the traveling direction, and can be moved together with the light source unit 120 by the light source moving mechanism 113. The distance between the blade 105 and the light source unit 120 is 30 mm, for example, but this distance can be changed as appropriate. The blade 105 is a flat plate-like member, and is moved by the light source moving mechanism 113 while being in contact with the surface of the photocurable resin 101 on its lower surface. In this manner, the blade 105 planarizes the surface of the photocurable resin 101.

The light source moving mechanism 113 can move the light source unit 120 and the blade 105 in three axial directions of the X direction, the Y direction, and the Z direction. When the modeled object 102 is formed, the light source moving mechanism 113 moves the light source unit 120 and the blade 105 in the scanning direction (Y direction), after positioning the light source unit 120 and the blade 105 on one end side (the exposure start position: the right side in FIG. 13) of the resin tank 103 in the Y direction. The light source moving mechanism 113 also moves, in the Z direction (upward), the light source unit 120 and the blade 105 that have moved to the other end side (the left side) of the resin tank 103 in the scanning direction (Y direction), so that the light source unit 120 and the blade 105 do not come into contact with the surface of the photocurable resin 101. After that, the light source moving mechanism 113 again moves the light source unit 120 and the blade 105 to the one end side (the right side) of the resin tank 103, to return them to the original positions. Note that, in a case where the width (in the X direction) of the modeled object 102 is great and exceeds the width with which the light source unit 120 can cure the photocurable resin 101, the light source moving mechanism 113 moves the light source unit 120 and the blade 105 in the X direction. The light source moving mechanism 113 may be designed to be capable of moving the light source unit 120 and the blade 105 in the two axial directions of the X direction and the Y direction in the horizontal direction, or may be designed to be capable of moving the light source unit 120 and the blade 105 only in the one axial direction of the Y direction in the horizontal.

The cooling mechanism 130 is attached to a side surface of the light source unit 120, and cools the light source unit 120 by receiving heat generated in the light source unit 120. The cooling mechanism 130 includes a housing 131 capable of containing water inside, and two tubes 132 connected to the housing 131. Of the two tubes 132, one tube 132 is a water supply tube, and the other tube 132 is a drainage tube. The circulation pump 134 is disposed in the water circulation path in the cooling mechanism 130, and water is circulated by the cooling mechanism 130.

Figure 15:
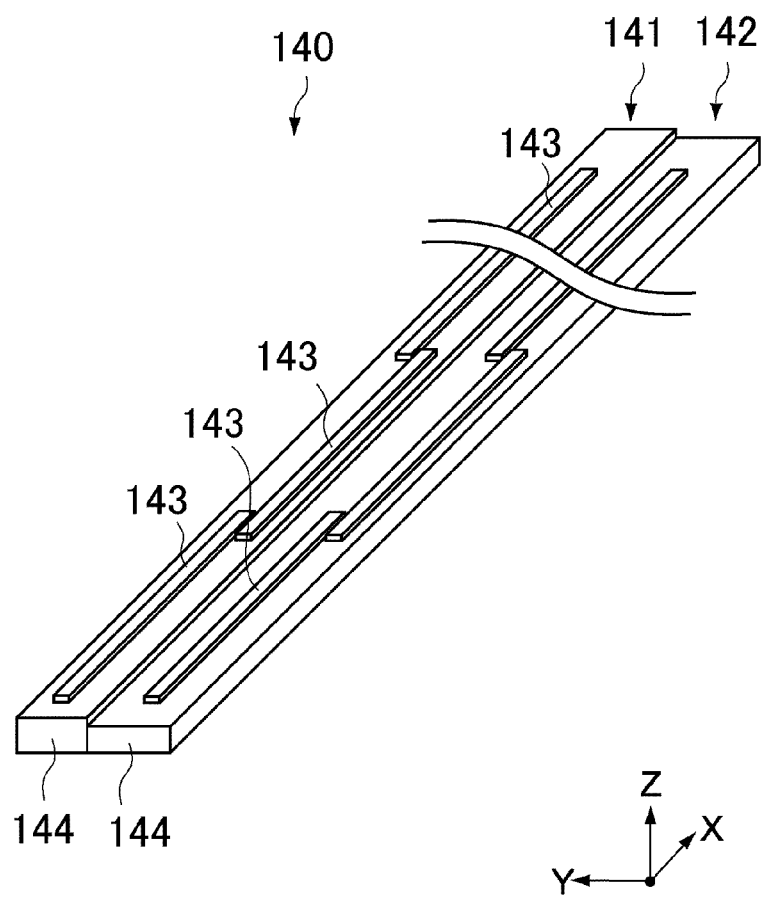
FIG. 15 is a perspective view of a light detection unit that forms the stereolithographic apparatus of the third embodiment.

FIG. 15 is a perspective view of the light detection unit 140. The light detection unit 140 is disposed on the front side (the lower side in FIG. 13) of the light source unit 120 in the light emission direction, and detects light emitted from the light source unit 120. The light detection unit 140 is disposed on a support 144 attached to an outer surface of the resin tank 103. The position at which the light detection unit 140 is disposed may be any position within the moving range (X-Y direction) of the light source unit 120.

The light detection unit 140 is designed to be capable of detecting light, while the distance L between the light source unit 120 and the light detection unit 140 varies. Specifically, the light detection unit 140 includes a first light detection unit 141, and a second light detection unit 142 disposed so that the distance from the light source unit 120 differs from that of the first light detection unit 141. That is, the distance between the light source unit 120 and the first light detection unit 141 is $L_1$, and the distance between the light source unit 120 and the second light detection unit 142 is $L_2$ ($>L_1$). Although a case where the number of the light detection units 140 is two is described herein, the number of the light detection units 140 may be one, or may be three or larger.

The first light detection unit 141 and the second light detection unit 142 each include a plurality of line sensors 143 that are long in the X direction (the array direction of the light emitting elements 21). The line sensors 143 include a plurality of light receiving elements arrayed in the X direction. The number of the light receiving elements included in one line sensor 143 is set at 5,400. Further, the distance between each two light receiving elements adjacent to each other is 4 µm, and the resolution is 4 µm. Here, the reason why the resolution of the line sensors 143 is set at a high value of 4 µm is that the light detection unit 140 accurately detects the distribution of the amount of light from the light emitting elements 21 at a narrow pitch. However, the number of the light receiving elements and the distance between the light receiving elements are not limited to these values, and can be changed as appropriate.

The plurality of line sensors 143 is arrayed in a staggered pattern, and is arrayed in a straight line. The reason why the plurality of line sensors 143 is arranged in a staggered pattern is now described. That is, in a case where the length of the line sensors 143 that can be taken out from one wafer is not as long as the target length, it is necessary to array a plurality of line sensors 143 in a straight line. On the other hand, as described above, the distance between adjacent light receiving elements is set at a small value of 4 µm. Further, in line sensors 143 adjacent to each other, the distance between the light receiving element disposed at the end of one line sensor 143 and the light receiving element disposed at the end of the other line sensor 143 also needs to be 4 µm. However, in a case where a plurality of line sensors 143 is simply arrayed in a straight line, the distance between the light receiving element disposed at the end of one line sensor 143 and the light receiving element disposed at the end of the other line sensor 143 cannot be 4 µm. Therefore, the plurality of line sensors 143 is arrayed in a staggered pattern, so that the distance between the light receiving element disposed at the end of one line sensor 143 and the light receiving element disposed at the end of the other line sensor 143 can be 4 µm.

The height of the first light detection unit 141 is set so that the height of the imaging plane matches the height of the (planarized) surface of the photocurable resin 101. That is, the distance $L_1$ from the lower end face of the light source unit 120 to the imaging plane of the first light detection unit 141 is equal to the distance $L_0$ from the lower end face of the light source unit 120 to the (planarized) surface of the photocurable resin 101 ($L_1 = L_0$).

On the other hand, the height of the second light detection unit 142 is set so that the height of the imaging plane is lower than the (planarized) surface of the photocurable resin 101 by the length equivalent to the exposure depth of $D_0$. That is, the distance $L_2$ from the lower end face of the light source unit 120 to the imaging plane of the second light detection unit 142 is equal to the value obtained by adding the exposure depth $D_0$ to the distance $L_0$ from the lower end face of the light source unit 120 to the (planarized) surface of the photocurable resin 101 ($L_2 = L_0 + D_0$). Note that the positions of the imaging planes of the first light detection unit 141 and the second light detection unit 142 can be changed, as appropriate, within the range between the (planarized) surface of the photocurable resin 101 and the position that is lower than the (planarized) surface by the length equivalent to the exposure depth $D_0$. That is, the positions of the imaging planes of the first light detection unit 141 and the second light detection unit 142 are set so that the conditions shown below are satisfied with the distance $L_0$, the distances ($L_1$, $L_2$), and the exposure depth $D_0$:

$$L_0 \leq L_1 < L_2 \leq L_0 + D_0$$

The control unit 111 (see FIG. 14) includes a central processing unit (CPU), for example, and comprehensively controls the respective components of the stereolithographic apparatus 100. For example, the control unit 111 performs a process of forming the modeled object 102, on the basis of modeling data (three-dimensional computer aided design (CAD) data).

The storage unit 114 includes a nonvolatile memory in which various kinds of programs and data required for the processing to be performed by the control unit 111 are stored, and a volatile memory to be used as a work area of the control unit 111. The programs may be read from a portable memory such as an optical disk or a semiconductor memory, or may be downloaded from a server device in a network.

Figure 16:
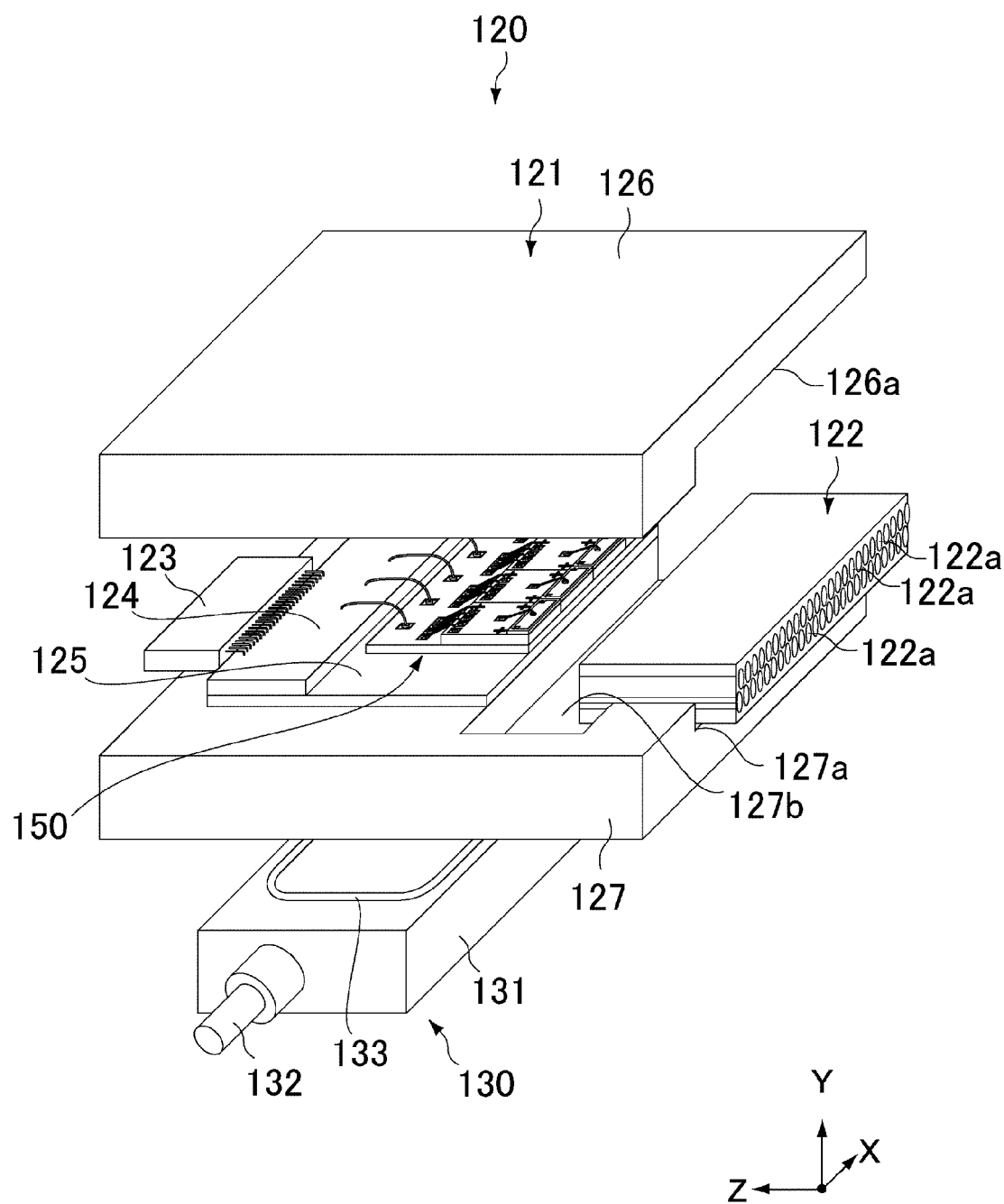
FIG. 16 is an exploded perspective view of a light source unit that forms the stereolithographic apparatus of the third embodiment.

Next, the configuration of the light source unit 120 is specifically described. FIG. 16 is an exploded perspective view of the light source unit 120. The size of the entire light source unit 120 is 420 mm in width (X direction), 30 mm in depth (Y direction), and 50 mm in height (Z direction), but is not limited to these values.

As shown in FIG. 16, the light source unit 120 includes a housing 121 that accommodates various components of the light source unit 120 therein, a light emitting module 150, and a condensing member (convergent rod lens) 122 disposed on the light emission side of the light emitting module 150, a connector 123, a glass epoxy substrate 124 to which the connector 123 is attached, and a heat transfer plate 125 on which the light emitting module 150 and the glass epoxy substrate 124 are mounted.

The housing 121 has a rectangular parallelepiped shape that is long in the X direction (the array direction of the light emitting elements 21), and includes a first base 126 and a second base 127. The housing 121 is formed with various metallic materials (stainless steel, for example). However, the material used for the housing 121 may be any material that has a strength and a thermal conductivity at a certain level or higher. The first base 126 and the second base 127 are secured with screws or the like, and are integrated to form the housing 121. The first base 126 has a groove portion 126a in which the convergent rod lens 122 is to be fitted, a groove portion (not shown) in which the connector 123 is to be fitted, and the like. Also, the second base 127 has a groove portion 127a in which the convergent rod lens 122 is to be fitted, a groove portion 127b formed between the light emitting module 150 and the convergent rod lens 122, and the like. On the second base 127, the cooling mechanism 130 is secured to a position on an outer surface with screws or the like via an O-ring 133, the position corresponding to the position at which the heat transfer plate 125 is disposed.

The condensing member (convergent rod lens) 122 condenses light emitted from the respective light emitting elements 21 of the light emitting module 150, and forms an image on the (planarized) surface of the photocurable resin 101. The convergent rod lens 122 is secured, being fitted into an opening of the housing 121. The opening is formed with the groove portion 126a of the first base 126 and the groove portion 127a of the second base 127. The convergent rod lens 122 is formed with a plurality of columnar lens portions (rod lens portions) 122a that are long in the Z direction and are arrayed in the X direction and the Y direction. As the convergent rod lens 122, a Selfoc lens array (Selfoc: registered trademark) manufactured by Nippon Sheet Glass Company, Limited is used. The focal length of the convergent rod lens 122 from the lower end face is about 2 mm.

The heat transfer plate 125 is formed with various kinds of metallic materials (copper, for example). Note that the material used for the heat transfer plate 125 may be any material that has a strength and a thermal conductivity at a certain level or higher. The light emitting module 150 and the glass epoxy substrate 124 are mounted on the heat transfer plate 125, and the heat transfer plate 125 on which these components are mounted is temporarily secured onto the second base 127 via an adhesive having a high thermal conductivity (an ultraviolet curable silver paste, for example). Further, the heat transfer plate 125 and the second base 127 are secured with screws from the side of the second base 127. Further, the heat transfer plate 125 and the second base 127 are secured with screws not in the region of the light emitting module 150 but in the region of the glass epoxy substrate 124. Note that the heat transfer plate 125 and the second base 127 are secured with screws not in the region of the light emitting module 150 but in the region of the glass epoxy substrate 124 as described above, so as not to affect the accuracy of the distances between the light emitting elements 21 in the light emitting module 150.

The connector 123 is electrically connected to the glass epoxy substrate 124, and the electric power and various kinds of signals for driving the light source unit 120 are input to the connector 123. The glass epoxy substrate 124 and the light emitting module 150 (specifically, a driver IC 151) are connected by wire bonding.

The gap between the first base 126 and the second base 127, the gap between the housing 121 and the convergent rod lens 122, and the gap between the housing 121 and the connector 123 are filled and sealed with an adhesive, to prevent ingress of volatile substances of the photocurable resin 101.

In the description below, the process of assembling the light source unit 120 is briefly explained.

First, the light emitting module 150, and the glass epoxy substrate 124 to which the connector 123 is attached are mounted on the heat transfer plate 125. Next, the light emitting module 150 (a driver IC 151) and the glass epoxy substrate 124 are connected by wire bonding.

Next, the heat transfer plate 125 on which the light emitting module 150 and the glass epoxy substrate 124 are mounted is temporarily secured onto the second base 127 via an adhesive (not shown) having a high thermal conductivity, and further, is secured with screws. The heat transfer plate 125 is secured with screws not in the region of the glass epoxy substrate 124 but in the region of the light emitting module 150.

Next, the first base 126 and the second base 127 are secured with screws. The convergent rod lens 122 is then secured to the opening of the housing 121, the opening being formed with the groove portion 126a of the first base 126 and the groove portion 127a of the second base 127. In this securing, to increase the accuracy of the imaging position, the position of the convergent rod lens 122 with respect to the light emitting module 150 is adjusted, and the convergent rod lens 122 is then temporarily secured to the housing 121 with an ultraviolet curable adhesive.

Next, the gap between the first base 126 and the second base 127, the gap between the housing 121 and the convergent rod lens 122, and the gap between the housing 121 and the connector 123 are filled and sealed with an adhesive. Lastly, the cooling mechanism 130 is screwed to the housing 121 (the second base 127).

Figure 17:
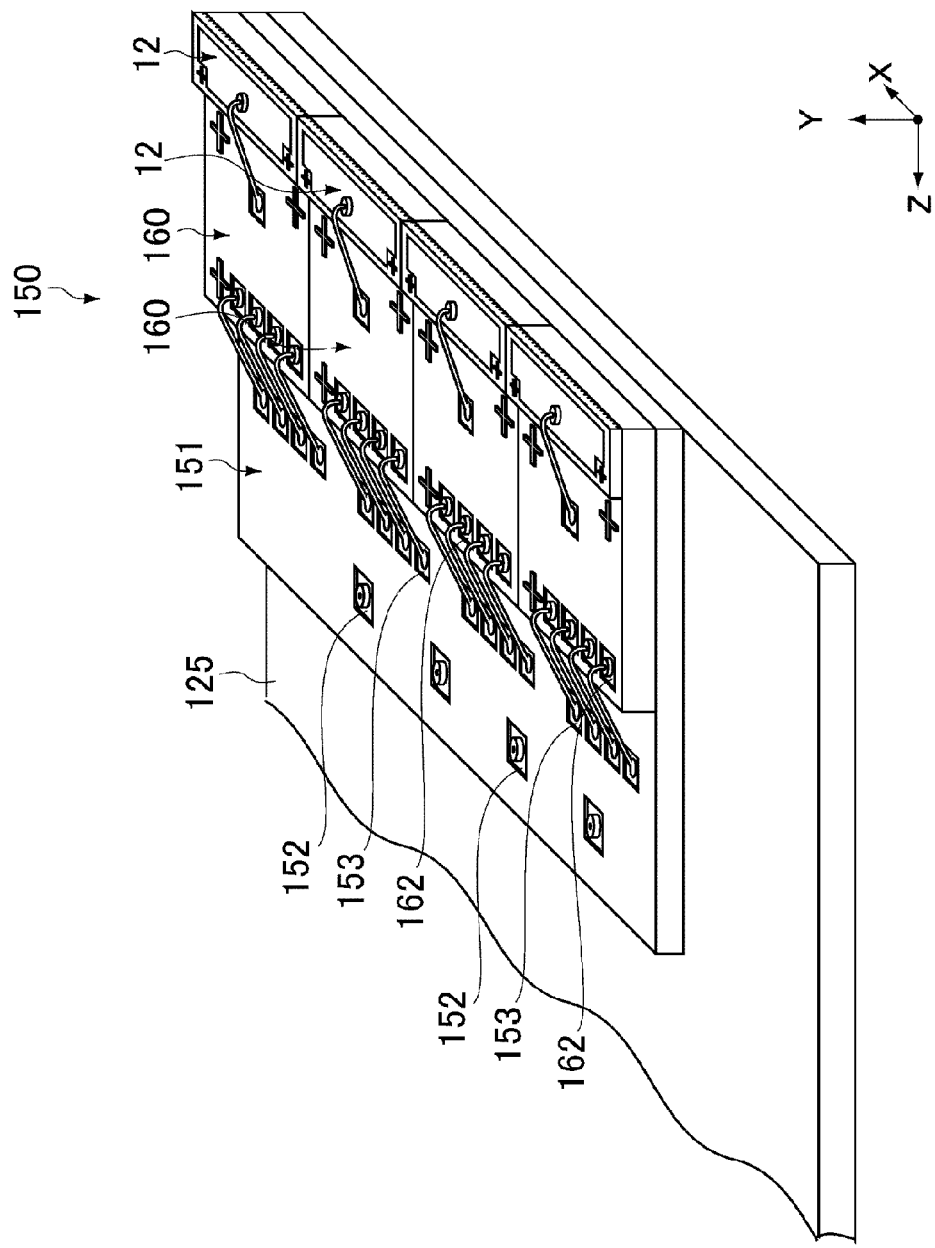
FIG. 17 is a perspective view of a light emitting module in the light source unit that forms the stereolithographic apparatus of the third embodiment.
Figure 18:
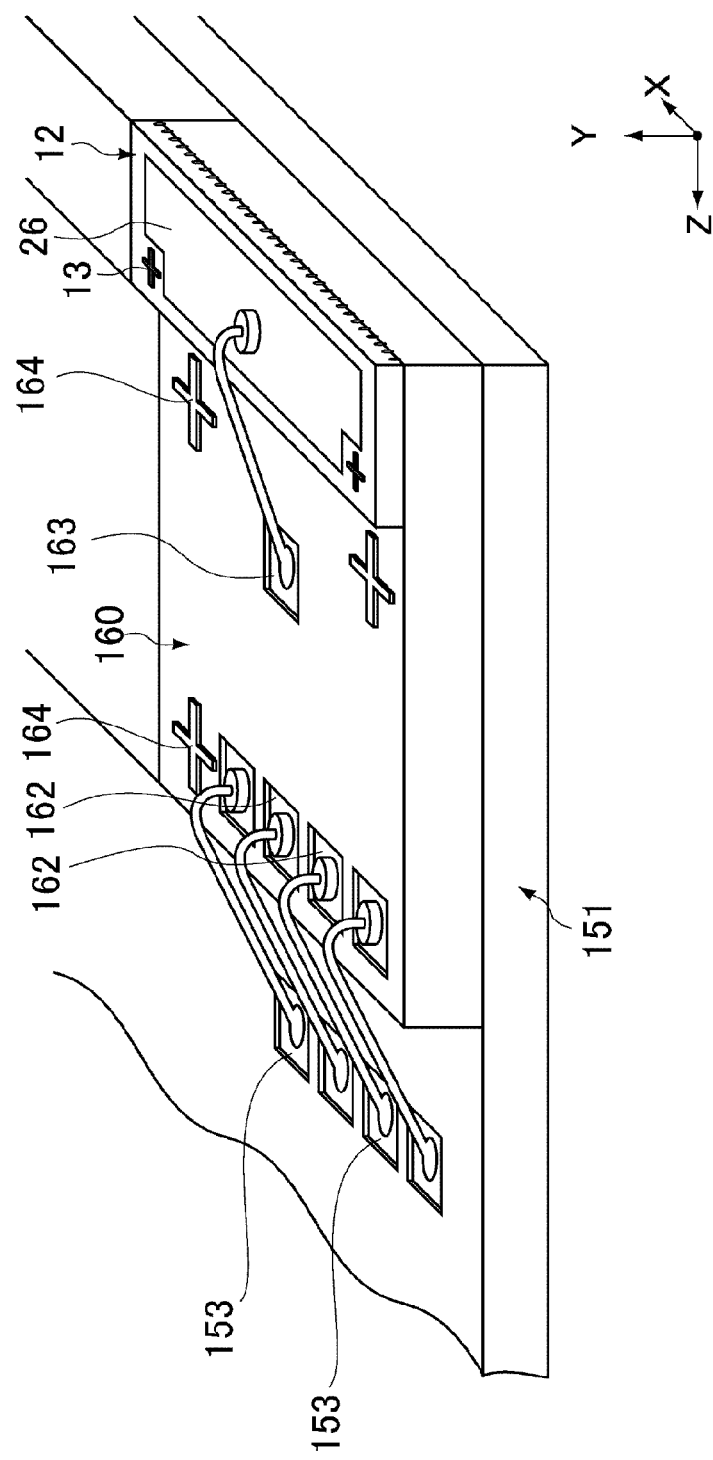
FIG. 18 is an enlarged perspective view of part of the light emitting module in the light source unit that forms the stereolithographic apparatus of the third embodiment.

In the description below, the configuration of the light emitting module 150 is specifically explained. FIG. 17 is a perspective view of the light emitting module 150 in the light source unit 120. FIG. 18 is an enlarged perspective view of part of the light emitting module 150.

As shown in these drawings, the light emitting module 150 includes a plurality of driver ICs 151 (mount members), a plurality of light emitting element drive units 30 (submounts (submount members) 160) mounted on the driver ICs 151, and multi-beam laser chips 12 (multi-illuminators) mounted on the submounts 160. Note that only one driver IC 151 is shown in FIG. 18, but the light emitting module 150 is formed with a plurality of driver ICs 151 arrayed in the X direction as shown in FIG. 17. Specifically, the number of the driver ICs 151 is 16, but the number of the driver ICs 151 included in the light emitting module 150 is not limited to any particular number and can be changed as appropriate. The size of a driver IC 151 is 20.47 mm in width (X direction), 5 mm in depth (Z direction), and 0.09 mm in height (Y direction), for example. The overall width (X direction) of the light emitting module 150 is about 330 mm, for example, and the size of the heat transfer plate 125 on which the light emitting module 150 is mounted is 350 mm in width (X direction), 30 mm in depth (Z direction), and 3 mm in height (Y direction), for example.

In a multi-beam laser chip 12, the first joining member 41 and the second joining member 42 are not disposed in the region on the outer side of the light emitting portion of the first light emitting element 21 and in the region on the outer side of the 2Nth light emitting element 21, the first joining member 41 and the second joining member 42 are disposed between the light emitting portion of the first light emitting element 21 and the light emitting portion of the second light emitting element 21, and the first joining member 41 and the second joining member 42 are disposed between the light emitting portion of the (2N−1)th light emitting element 21 and the light emitting portion of the 2Nth light emitting element 21.

With such arrangement, the distance between the light emitting element 21 located at the end of one of two multi-beam laser chips 12 adjacent to each other and the light emitting element 21 located at the end of the other one of the two multi-beam laser chips 12 can be made equal to the distance between the light emitting elements 21 in the same multi-beam laser chip 12. Accordingly, a modeled object can be formed more accurately than in a case where the distance between light emitting elements of two multi-beam laser chips adjacent to each other is different from the distance between the light emitting elements in a multi-beam laser chip. Particularly, even if the distance between the light emitting elements is as narrow as 100 μm or shorter, the distance between the light emitting elements 21 of two multi-beam laser chips adjacent to each other can be made equal to the distance (20 μm) between the light emitting elements in a multi-beam laser chip.

The driver ICs 151 are formed with silicon substrates, for example. Further, a driver IC 151 has a plurality of input electrode pads 152 and a plurality of output electrode pads 153 on its top surface. The input electrode pads 152 are connected to the glass epoxy substrate 124 by wire bonding. Meanwhile, the output electrode pads 153 are connected to input electrode pads 162 on the submounts 160 by wire bonding.

A driver IC 151 includes a drive circuit for driving each light emitting element (laser element) 21 included in the multi-beam laser chips 12 on the plurality of submounts 160 mounted on the driver IC 151. A signal for controlling the light emission timing and the light emitting time for driving each light emitting element 21 is input from the control unit 111 to the drive circuit. On the basis of this signal, the drive circuit causes each light emitting element 21 to emit light, via switching circuits in the submounts 160. One light emitting time at a light emitting element 21 is 1 µsec, and the number of times light emission is performed per unit time is controlled to adjust the integrated light amount.

Note that the sixteen driver ICs 151 control light emission of different light emitting elements 21 from one another, and therefore, different signals from one another are input from the control unit 111 to the sixteen driver ICs 151.

Thirty-two light emitting element drive units 30 (the submounts 160) are mounted on one driver IC 151 in the X direction (the array direction of the light emitting elements 21). Note that the number of the submounts 160 to be mounted on one driver IC 151 is not limited to any particular number, and can be changed as appropriate. The submounts 160 are secured onto the driver ICs 151 via an adhesive (not shown) having a high thermal conductivity (an ultraviolet curable silver paste, for example). The size of a submount 160 is 630 µm in width (X direction), 1000 µm in depth (Z direction), and 90 µm in height (Y direction), for example. The submounts 160 are formed with silicon substrates, for example. A submount 160 has a plurality of joining pads (not shown), a plurality of input electrode pads 162, and one common electrode pad 163 on its top surface. A submount 160 also has a plurality of alignment marks 164 on its top surface.

The joining pads (not shown) are formed with Au plating layers of 10 µm in thickness. These joining pads are electrically connected to the second electrodes 27 of the multi-beam laser chip 12. The positions and the shape of the joining pads are the same as the positions and the shape of the second electrodes 27 in the multi-beam laser chip 12. The plurality of input electrode pads 162 is connected to the output electrode pads 153 of the driver IC 151 by wire bonding. The number of the input electrode pads 162 is four, and the size of each input electrode pad is 90 µm×90 µm. The four input electrode pads 162 are used for power supply, GND, first switching pulse input, and second switching pulse input, for example. The common electrode pad 163 is connected to the first electrode 26 shared (common) in the multi-beam laser chip 12, by wire bonding. The size of the common electrode pad 163 is 90 µm×90 µm.

A submount 160 includes a switching circuit for individually switching each light emitting element 21 of the multi-beam laser chip 12 mounted on the submount 160, to cause each light emitting element 21 to emit light. Specifically, the switching circuit switches the plurality of light emitting elements 21 in the multi-beam laser chip 12 to emit light in response to a switching pulse input from the driver IC 151 (the drive circuit) via the input electrode pads 162.

The alignment marks 164 are used when the multi-beam laser chips 12 are mounted on the submounts 160, and are also used when the submounts 160 on which the multi-beam laser chips 12 are mounted are mounted on the driver ICs 151.

One multi-beam laser chip 12 is mounted on one submount 160. Note that a plurality of multi-beam laser chips 12 may be mounted on one submount 160. The size of a multi-beam laser chip 12 is 630 µm (same as the width of a submount 160) in width (X direction), 280 µm in depth (Z direction), and 90 µm in height (Y direction), for example.

A multi-beam laser chip 12 includes a plurality of light emitting elements (laser elements) 21 that are long in the Z direction. The plurality of light emitting elements 21 is arranged at predetermined interval in the X direction, and emit light in the Z direction. The oscillation wavelength of the light emitting elements (laser elements) 21 is 405 nm. A multi-beam laser chip 12 has a first electrode 26 shared (common) among the plurality of light emitting elements 21 and alignment marks 13 on its top surface, and has a plurality of second electrodes 27 for supplying electric power to each of the plurality of light emitting elements 21.

The number of the light emitting elements 21 included in one multi-beam laser chip 12 is 32, but this number can be changed as appropriate. Further, the distance between two light emitting elements 21 adjacent to each other (the distance between the ridge portions 24) is 20 µm, and the distance between the light emitting elements 21 can also be changed as appropriate. However, the distance between the light emitting elements 21 is typically 100 µm or shorter.

Here, in the light emitting module 150, the number of the driver ICs 151 is 16, the number of the submounts 160 mounted on one driver IC 151 is 32, and the number of the light emitting elements 21 corresponding to one submount 160 is 32. Accordingly, the light emitting module 150 includes a total of 16384 (=16×32×32) light emitting elements (laser elements) 21.

A first electrode 26 is formed on the entire top surface of a multi-beam laser chip 12, and is connected to the common electrode pad 163 on the submount 160 by wire bonding. The first electrode 26 is formed with a stack of an alloy of Au and Ge, Ni, Au, and the like, for example. The alignment marks 13 are used when the multi-beam laser chips 12 are mounted on the submounts 160, and are also used when the submounts 160 on which the multi-beam laser chips 12 are mounted are mounted on the driver ICs 151.

Here, the two second electrodes 27 that supply electric power to two light emitting elements 21 adjacent to each other are disposed in the region between the two light emitting elements 21 adjacent to each other (a region on the lower surface of the multi-beam laser chip 12).

In other words, the region between the two light emitting elements 21 adjacent to each other is used as the one region in which the two second electrodes 27 that supply electric power to the two respective light emitting elements 21 adjacent to each other are disposed.

A second electrode 27 includes an electrode main body and a plating portion formed on the electrode main body. The electrode main body is formed with a stack of Ti, Pt, Au, and the like, for example. The electrode main body includes a coating portion formed so as to cover a light emitting element 21, and a base portion extending from the coating portion. The size of the base portion is about half the size of the region between two light emitting elements 21 adjacent to each other. Further, one of the two base portions disposed in this region is located on the front side (Z direction), and the other one is located on the back side (Z direction). Note that, in practice, the shape of the second electrodes 27 is longer in the Z direction than that shown in FIG. 12.

The plating portion is formed with an Au plating of 2 µm in thickness. Au—Au ultrasonic joining of this plating portion formed with Au to the joining pads (including Au) on the submount 160 is performed, so that the multi-beam laser chip 12 is flip-chip mounted on the submount 160. Note that the joining method is not limited to this, and may be Au—Sn joining, Cu—Cu joining, or the like.

Meanwhile, light emitted from the respective light emitting elements (laser elements) 21 is converged by the condensing member (the convergent rod lens) 122, and forms images at different imaging positions in the X direction. In stereolithography, one light emitting element 21 exposes a region of one dot. In this region of one dot, light is strongest at the center of imaging, and light becomes weaker at a position farther away from the center of imaging. On the other hand, in stereolithography, the two dots cured by two light emitting elements 21 adjacent to each other need to be appropriately connected. That is, if the distance between two light emitting elements 21 adjacent to each other is too long, the imaging centers of the respective light emitting elements 21 are separated, and the two dots cannot be appropriately connected. Therefore, it is preferable to set the distance between light emitting elements 21 adjacent to each other so as to satisfy the relationship, $P_C \geq 0.5 \times P_A$, as mentioned above. Note that, since the relationship between $P_C$ and $P_A$ changes depending on the exposure sensitivity of the photocurable resin 101 and the like, adjacent dots are only required to be appropriately connected, regardless of this relational expression.

Light emitting element assemblies, multi-beam laser chip assemblies, a stereolithographic apparatus, and a member assembly and a method for manufacturing the member assembly of the present disclosure have been described above on the basis of embodiments, but these are not limited to the embodiments. Instead of providing a first joining member 41 on a light emitting element 21 and providing a second joining member 42 on a light emitting element drive unit 30, it is possible to provide a first joining member 41 on a light emitting element drive unit 30, and a second joining member 42 on a light emitting element 21. The light emitting elements may be some other light emitting elements, such as light emitting diodes (LEDs).

As for the layout of the light emitting elements, a first joining member and a second joining member may be disposed between the light emitting portion of the mth light emitting element and the light emitting portion of the (m+1)th light emitting element [here, m=1, 2, 3, . . . , (2N−1)], while a first joining member and a second joining member are not disposed between the light emitting portion of a desired m'th light emitting element and the light emitting portion of the (m'+1) the light emitting element [here, m' is an integer of 2 to (2N−1)].

Further, the multi-beam laser chips 12 may be disposed on the lower side of the submounts 160, not on the upper side of the submounts 160, and the submounts 160 may be mounted on the driver ICs 151 by flip-chip mounting, not by wire bonding.

In an embodiment, a case where the light emitting module 150 is applied to the stereolithographic apparatus 100 has been described, but the light emitting module 150 can be applied to various kinds of apparatuses such as a laser printer, a laser display apparatus, and a measuring apparatus.

Note that the present disclosure can also be embodied in the configurations described below.

[A01]<<Light emitting element assembly>>
A light emitting element assembly including:
a light emitting element;
a light emitting element drive unit;
a first joining member connected to an electrode provided in the light emitting element; and
a second joining member provided on the light emitting element drive unit,
in which
one of the first joining member and the second joining member includes an alloy material,
the other one of the first joining member and the second joining member includes a metallic material,
the joining member including the alloy material includes a first portion and a second portion,
the joining member including the metallic material and the first portion are joined to each other, and,
between the light emitting element and the light emitting element drive unit, the second portion is provided on one of the light emitting element and the light emitting element drive unit, and is in contact with the other one of the light emitting element and the light emitting element drive unit.

[A02] The light emitting element assembly according to [A01], in which the second portion is disposed next to the first portion.

[A03] The light emitting element assembly according to [A01], in which the second portion is disposed at a distance from the first portion.

[A04] The light emitting element assembly according to any one of [A01] to [A03], which satisfies $H_1 < H_2$, where $H_1$ represents the height of the first portion, and $H_2$ represents the height of the second portion.

[A05] The light emitting element assembly according to any one of [A01] to [A04], in which the alloy material contains atoms forming the metallic material.

[A06] The light emitting element assembly according to [A05], in which the first portion and the joining member including the metallic material are joined on the basis of eutectic crystal accompanied by diffusion of the atoms forming the metallic material.

[A07] The light emitting element assembly according to [A05] or [A06], in which the alloy material includes a gold-tin solder material, and the metallic material includes gold.

[A08] The light emitting element assembly according to any one of [A05] to [A07], in which the melting point of the alloy material forming the region of the first portion adjacent to the joining member including the metallic material is lower than the melting point of the alloy material forming the second portion.

[A09] The light emitting element assembly according to [A08], in which the composition of the alloy material forming the region of the first portion adjacent to the joining member including the metallic material is different from the composition of the alloy material forming the second portion.

[A10] The light emitting element assembly according to any one of [A06] to [A09], in which
the tin content of the alloy material that includes a gold-tin solder material, and forms the region of the first portion adjacent to the joining member including the metallic material is 18% by mass to 29% by mass, and
the tin content of the alloy material that includes a gold-tin solder material and forms the second portion is smaller than 18% by mass or is greater than 29% by mass.

[A11] The light emitting element assembly according to any one of [A01] to [A10], in which the light emitting element includes a laser element that emits light from an end face.

[B01]<<Multi-beam laser chip assembly>>
A multi-beam laser chip assembly including
a plurality of light emitting element assemblies that are arranged adjacent to one another,
in which
each light emitting element assembly includes:
a light emitting element including a laser element;
a light emitting element drive unit;
a first joining member connected to an electrode provided in the light emitting element; and
a second joining member provided on the light emitting element drive unit,
one of the first joining member and the second joining member includes an alloy material,
the other one of the first joining member and the second joining member includes a metallic material,
the joining member including the alloy material includes a first portion and a second portion,
the joining member including the metallic material and the first portion are joined to each other, and,
between the light emitting element and the light emitting element drive unit, the second portion is provided on one of the light emitting element and the light emitting element drive unit, and is in contact with the other one of the light emitting element and the light emitting element drive unit.

[B02] The multi-beam laser chip assembly according to [B01], in which, where n is an integer not smaller than 1 and not greater than N, the first joining member and the second joining member are disposed between the light emitting portion of the (2n−1)th light emitting element and the light emitting portion of the 2nth light emitting element, and are not disposed between the light emitting portion of the 2nth light emitting element and the light emitting portion of the (2n+1)th light emitting element.

[B03] The light emitting element assembly according to [B01] or [B02], in which the distance between the light emitting portions of the light emitting elements is not shorter than 10 µm and not longer than 50 µm.

[B04] The light emitting element assembly according to any one of [B01] to [B03], in which the light emitting element drive unit includes a submount.

[B05] The light emitting element assembly according to any one of [B01] to [B03], in which the light emitting element drive unit includes a semiconductor substrate in which a light emitting element drive circuit is provided.

[B06] The light emitting element assembly according to any one of [B01] to [B05], in which the light emitting element includes the light emitting element according to any one of [A01] to [A11].

[C01]<<Stereolithographic apparatus>>
A stereolithographic apparatus including:
a multi-beam laser chip assembly; and
a condensing member that condenses light emitted from the multi-beam laser chip assembly,
in which
the multi-beam laser chip assembly includes a plurality of light emitting element assemblies that are arranged adjacent to one another,
each light emitting element assembly includes:
a light emitting element including a laser element;
a light emitting element drive unit;
a first joining member connected to an electrode provided in the light emitting element; and
a second joining member provided on the light emitting element drive unit,
one of the first joining member and the second joining member includes an alloy material,
the other one of the first joining member and the second joining member includes a metallic material,
the joining member including the alloy material includes a first portion and a second portion,
the joining member including the metallic material and the first portion are joined to each other, and,
between the light emitting element and the light emitting element drive unit, the second portion is provided on one of the light emitting element and the light emitting element drive unit, and is in contact with the other one of the light emitting element and the light emitting element drive unit.

[C02] The stereolithographic apparatus according to [C01], in which the condensing member includes a convergent rod lens.

[C03] The stereolithographic apparatus according to [C01] or [C02], in which the light emitting element includes the light emitting element according to any one of [A01] to [A11].

[C04]<<Member assembly>>
A member assembly including:
a first member;
a second member;
a first joining member provided on the first member; and
a second joining member provided on the second member,
in which
the first joining member includes a metallic material,
the second joining member includes an alloy material,
the second joining member includes a first portion and a second portion,
the first joining member and the first portion are joined to each other, and
the second portion is disposed between the first member and the second member, and is in contact with the first member.

[C05]<<Method for manufacturing a member assembly>>
A method for manufacturing a member assembly, including:
preparing a first member on which a first joining member including a metallic material is provided, and a second member that includes a first portion and a second portion, a second joining member including an alloy material being provided on the second member; and,
with the first portion of the second joining member being in contact with the first joining member, melting and joining the first portion to the first joining member, and bringing the second portion into contact with the first member, by heating the first joining member and the second joining member while applying pressure between the first member and the second member.

REFERENCE SIGNS LIST

11 Multi-beam laser chip assembly
12 Multi-beam laser chip
13 Alignment mark
20 Light emitting element assembly
21 Light emitting element (first member)
21' Light emitting element extension portion
22 Substrate
23 Stack structure
23A First compound semiconductor layer
23B Second compound semiconductor layer
23C Light emitting layer (active layer)

23D Contact layer
24 Ridge portion (optical waveguide)
24A Light emitting region
25 Insulating layer
26 First electrode
27 Second electrode
30 Light emitting element drive unit (second member)
41 First joining member
42 Second joining member
42' Second joining member before joining
43, 45 First portion
44, 46, 47 Second portion
100 Stereolithographic apparatus
101 Photocurable resin
102 Modeled object
103 Resin tank
104 Stage
105 Blade
111 Control unit
112 Stage elevating mechanism
113 Light source moving mechanism
114 Storage unit
120 Light source unit
121 Housing
122 Condensing member (rod lens)
122a Lens portion (rod lens portion)
123 Connector
124 Glass epoxy substrate
125 Heat transfer plate
126 First base
127 Second base
126a, 127a, 127b Groove portion
130 Cooling mechanism
131 Housing
132 Tube
133 O-ring
134 Circulation pump
140 Light detection unit
141 First light detection unit
142 Second light detection unit
143 Line sensor
144 Support
150 Light emitting module
151 Driver IC
152 Input electrode pad
153 Output electrode pad
160 Submount (submount member)
162 Input electrode pad
163 Common electrode pad
164 Alignment mark

The invention claimed is:

1. A light emitting element assembly comprising:
a light emitting element;
a light emitting element drive unit;
a first joining member connected to an electrode provided in the light emitting element; and
a second joining member provided on the light emitting element drive unit,
wherein
one of the first joining member and the second joining member includes an alloy material,
the other one of the first joining member and the second joining member includes a metallic material, the metallic material being a different composition from the alloy material,
the joining member including the alloy material includes a first portion and a second portion,
the joining member including the metallic material and the first portion are joined to each other,
between the light emitting element and the light emitting element drive unit, the second portion is provided on one of the light emitting element and the light emitting element drive unit, and is in contact with the other one of the light emitting element and the light emitting element drive unit, and
the second portion is disposed at a distance from the first portion.

2. The light emitting element assembly according to claim 1, wherein the second portion is disposed next to the first portion.

3. The light emitting element assembly according to claim 1, which satisfies $H_1 < H_2$, where $H_1$ represents a height of the first portion, and $H_2$ represents a height of the second portion.

4. The light emitting element assembly according to claim 1, wherein a composition of the alloy material contains atoms of a same material as that in the metallic material.

5. The light emitting element assembly according to claim 4, wherein the first portion and the joining member including the metallic material are joined on a basis of eutectic crystal accompanied by diffusion of the atoms forming the metallic material.

6. The light emitting element assembly according to claim 4, wherein the alloy material includes a gold-tin solder material, and the metallic material includes gold.

7. The light emitting element assembly according to claim 1, wherein the light emitting element includes a laser element that emits light from an end face.

8. A light emitting element assembly comprising:
a light emitting element;
a light emitting element drive unit;
a first joining member connected to an electrode provided in the light emitting element; and
a second joining member provided on the light emitting element drive unit,
wherein
one of the first joining member and the second joining member includes an alloy material,
the other one of the first joining member and the second joining member includes a metallic material, the metallic material being a different composition from the alloy material,
the joining member including the alloy material includes a first portion and a second portion,
the joining member including the metallic material and the first portion are joined to each other,
between the light emitting element and the light emitting element drive unit, the second portion is provided on one of the light emitting element and the light emitting element drive unit, and is in contact with the other one of the light emitting element and the light emitting element drive unit, and
a melting point of the alloy material forming a region of the first portion adjacent to the joining member including the metallic material is lower than a melting point of the alloy material forming the second portion.

9. The light emitting element assembly according to claim 8, wherein a composition of the alloy material forming the region of the first portion adjacent to the joining member including the metallic material is different from a composition of the alloy material forming the second portion.

10. A light emitting element assembly comprising:
a light emitting element;
a light emitting element drive unit;
a first joining member connected to an electrode provided in the light emitting element; and
a second joining member provided on the light emitting element drive unit,
wherein
one of the first joining member and the second joining member includes an alloy material,
the other one of the first joining member and the second joining member includes a metallic material, the metallic material being a different composition from the alloy material,
the joining member including the alloy material includes a first portion and a second portion,
the joining member including the metallic material and the first portion are joined to each other,
between the light emitting element and the light emitting element drive unit, the second portion is provided on one of the light emitting element and the light emitting element drive unit, and is in contact with the other one of the light emitting element and the light emitting element drive unit,
a tin content of the alloy material that includes a gold-tin solder material, and forms a region of the first portion adjacent to the joining member including the metallic material is 18% by mass to 29% by mass, and
a tin content of the alloy material that includes a gold-tin solder material and forms the second portion is smaller than 18% by mass or is greater than 29% by mass.

11. A multi-beam laser chip assembly comprising
a plurality of light emitting element assemblies that are arranged adjacent to one another,
wherein
each light emitting element assembly includes:
a light emitting element including a laser element;
a light emitting element drive unit;
a first joining member connected to an electrode provided in the light emitting element; and
a second joining member provided on the light emitting element drive unit,
one of the first joining member and the second joining member includes an alloy material,
the other one of the first joining member and the second joining member includes a metallic material, the metallic material being a different composition from the alloy material,
the joining member including the alloy material includes a first portion and a second portion,
the joining member including the metallic material and the first portion are joined to each other,
between the light emitting element and the light emitting element drive unit, the second portion is provided on one of the light emitting element and the light emitting element drive unit, and is in contact with the other one of the light emitting element and the light emitting element drive unit, and
the second portion is disposed at a distance from the first portion.

12. The multi-beam laser chip assembly according to claim 11, wherein, where n is an integer not smaller than 1 and not greater than N, the first joining member and the second joining member are disposed between a light emitting portion of (2n−1)th light emitting element and a light emitting portion of a 2nth light emitting element, and are not disposed between a light emitting portion of the 2nth light emitting element and a light emitting portion of a (2n+1)th light emitting element.

13. The light emitting element assembly according to claim 11, wherein a distance between respective ones of light emitting portions of at least some of the light emitting elements is not shorter than 10 μm and not longer than 50 μm.

14. The light emitting element assembly according to claim 11, wherein the light emitting element drive unit of at least one light emitting element assembly includes a submount.

15. The light emitting element assembly according to claim 11, wherein the light emitting element drive unit includes a semiconductor substrate in which a light emitting element drive circuit is provided.

16. A stereolithographic apparatus comprising:
a multi-beam laser chip assembly; and
a condensing member that condenses light emitted from the multi-beam laser chip assembly,
wherein
the multi-beam laser chip assembly includes a plurality of light emitting element assemblies that are arranged adjacent to one another,
each light emitting element assembly includes:
a light emitting element including a laser element;
a light emitting element drive unit;
a first joining member connected to an electrode provided in the light emitting element; and
a second joining member provided on the light emitting element drive unit,
one of the first joining member and the second joining member includes an alloy material,
the other one of the first joining member and the second joining member includes a metallic material, the metallic material being a different composition from the alloy material,
the joining member including the alloy material includes a first portion and a second portion,
the joining member including the metallic material and the first portion are joined to each other,
between the light emitting element and the light emitting element drive unit, the second portion is provided on one of the light emitting element and the light emitting element drive unit, and is in contact with the other one of the light emitting element and the light emitting element drive unit, and
the second portion is disposed at a distance from the first portion.

17. The stereolithographic apparatus according to claim 16, wherein the condensing member includes a convergent rod lens.

* * * * *